(12) United States Patent
Dhar

(10) Patent No.: US 9,575,244 B2
(45) Date of Patent: Feb. 21, 2017

(54) LIGHT GUIDE APPARATUS AND FABRICATION METHOD THEREOF

(71) Applicant: Bal Makund Dhar, Gaithersburg, MD (US)

(72) Inventor: Bal Makund Dhar, Gaithersburg, MD (US)

( * ) Notice: Subject to any disclaimer, the term of this patent is extended or adjusted under 35 U.S.C. 154(b) by 356 days.

(21) Appl. No.: 14/148,388

(22) Filed: Jan. 6, 2014

(65) Prior Publication Data
US 2015/0101652 A1    Apr. 16, 2015

Related U.S. Application Data

(60) Provisional application No. 61/749,168, filed on Jan. 4, 2013.

(51) Int. Cl.

| | | |
|---|---|---|
| *G02B 6/02* | (2006.01) |
| *G02B 6/26* | (2006.01) |
| *G02B 6/42* | (2006.01) |
| *F24J 2/10* | (2006.01) |
| *F24J 2/15* | (2006.01) |
| *F21V 8/00* | (2006.01) |
| *H02S 40/22* | (2014.01) |
| *F24J 2/06* | (2006.01) |
| *G02B 6/032* | (2006.01) |
| *G02B 6/10* | (2006.01) |

(52) U.S. Cl.
CPC ............... *G02B 6/02* (2013.01); *F24J 2/067* (2013.01); *F24J 2/10* (2013.01); *F24J 2/15* (2013.01); *G02B 6/0036* (2013.01); *H02S 40/22* (2014.12); *G02B 6/032* (2013.01); *G02B 6/10* (2013.01); *G02B 6/4214* (2013.01); *G02B 6/4287* (2013.01); *G02B 6/4298* (2013.01); *Y02E 10/40* (2013.01); *Y02E 10/52* (2013.01); *Y10T 29/49826* (2015.01); *Y10T 29/49888* (2015.01)

(58) Field of Classification Search
CPC ............... F24J 2/12–2/15; F24J 2/067; F24J 2002/1004; F24J 2002/1014; F24J 2002/1038; H02S 40/22; G02B 19/0042
USPC ............ 385/123, 31, 43; 126/680, 684–687; 136/246, 259
See application file for complete search history.

(56) References Cited

U.S. PATENT DOCUMENTS

| | | | | |
|---|---|---|---|---|
| 4,060,308 A * | 11/1977 | Barnoski | ............. | G02B 6/2852 385/28 |
| 5,648,873 A * | 7/1997 | Jaster | ............. | F21S 11/00 359/591 |
| 8,385,708 B2 * | 2/2013 | Nyhart, Jr. | ............. | F24J 2/06 126/685 |
| 2004/0114858 A1 | 6/2004 | Komine | | |
| 2007/0171418 A1* | 7/2007 | Nyhart | ............. | F24J 2/06 356/364 |
| 2007/0177845 A1* | 8/2007 | Long | ............. | G02B 6/14 385/123 |
| 2008/0107387 A1 | 5/2008 | Raszka et al. | | |
| 2011/0011449 A1 | 1/2011 | Morgan et al. | | |
| 2011/0110627 A1 | 5/2011 | Tsai | | |
| 2011/0158596 A1 | 6/2011 | Terada et al. | | |
| 2012/0067419 A1 | 3/2012 | Das | | |

* cited by examiner

*Primary Examiner* — Robert Tavlykaev
(74) *Attorney, Agent, or Firm* — Burns & Levinson LLP; Orlando Lopez

(57) ABSTRACT

A light guide apparatus that can redirect light impinging on the apparatus over a wide range of incident angles and can concentrate light without using a tracking system and methods for fabrication.

16 Claims, 42 Drawing Sheets

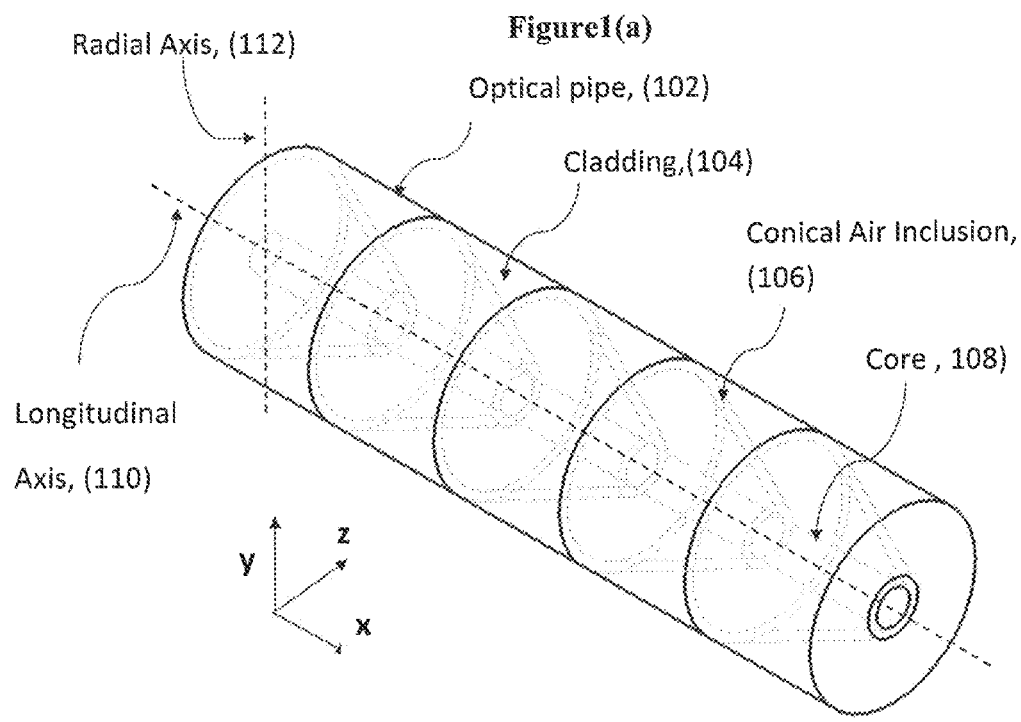
Figure1(a)
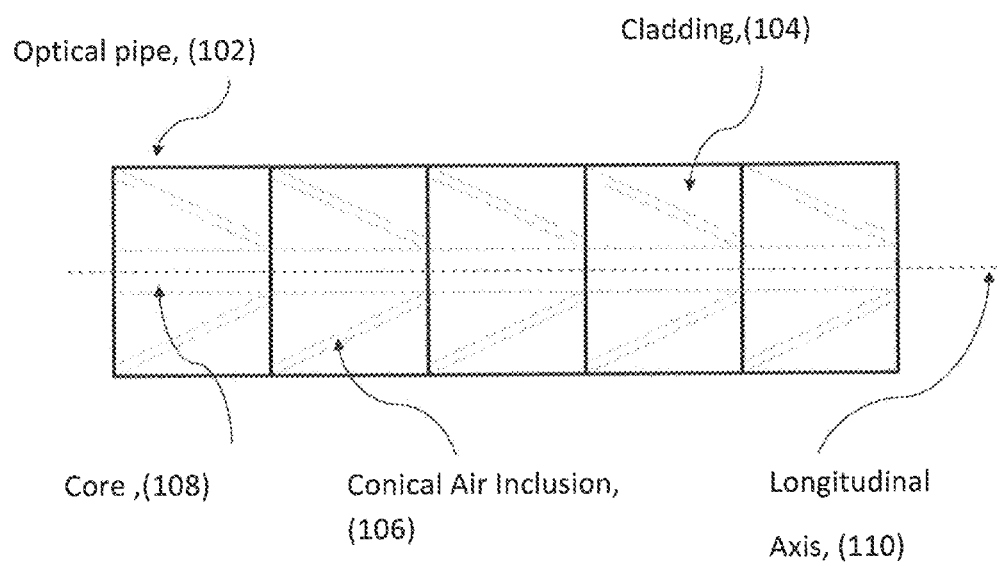

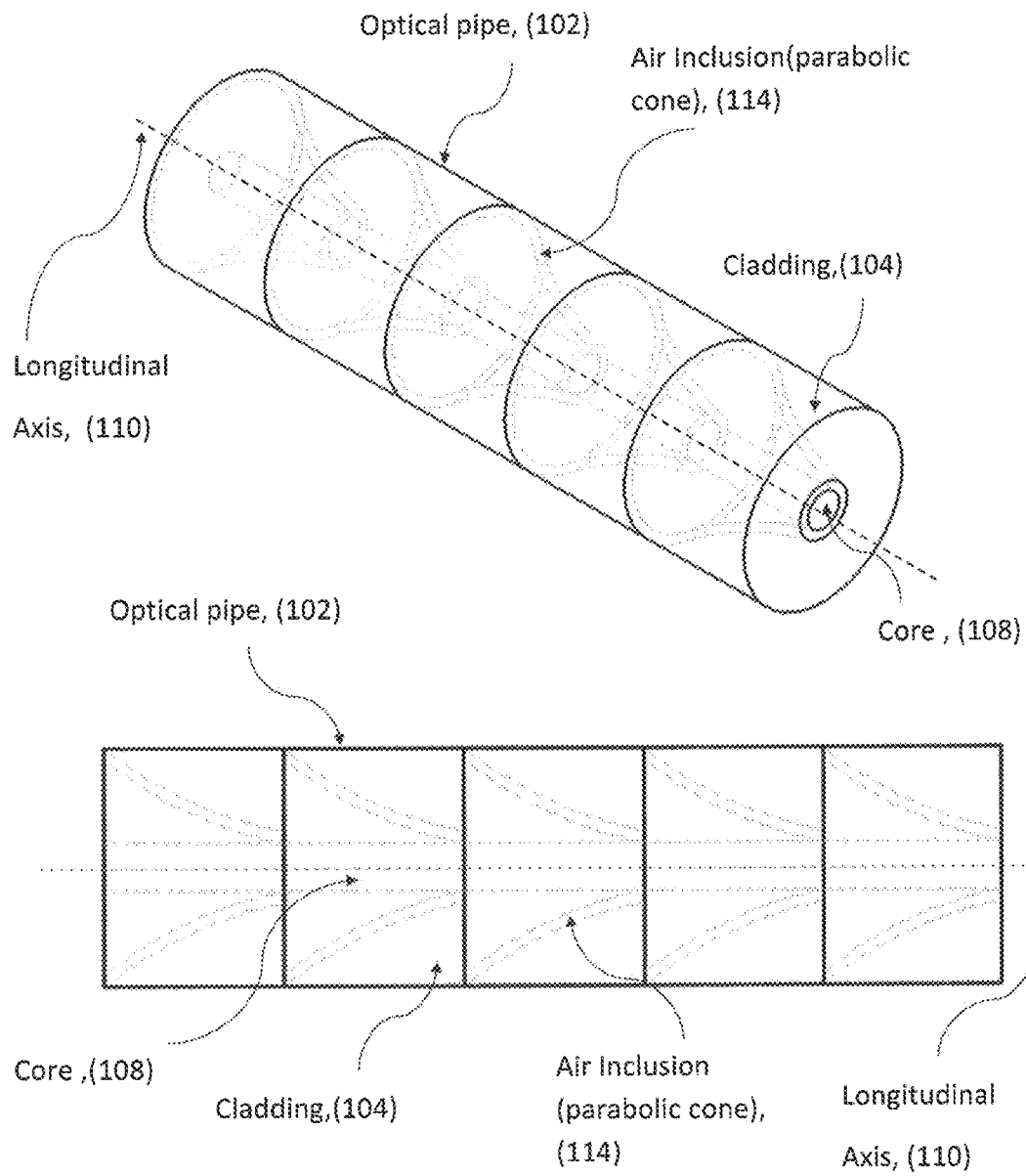

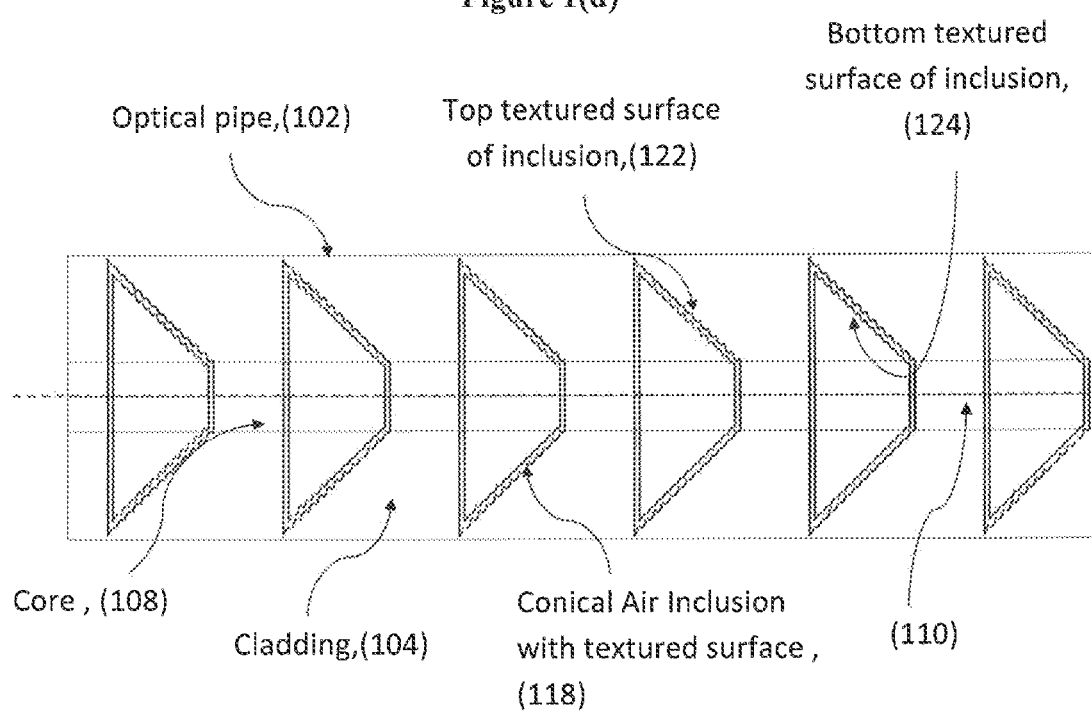

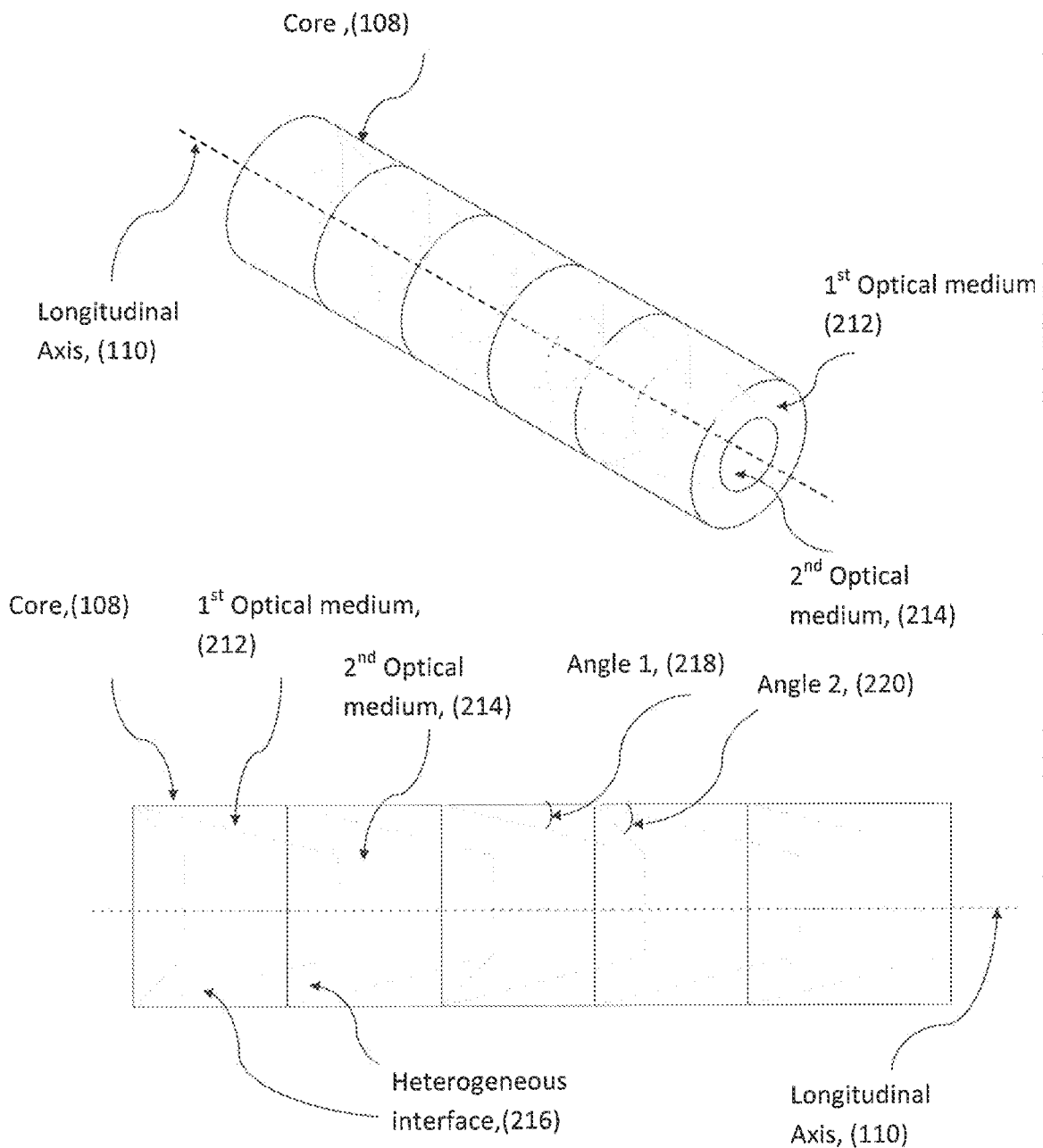

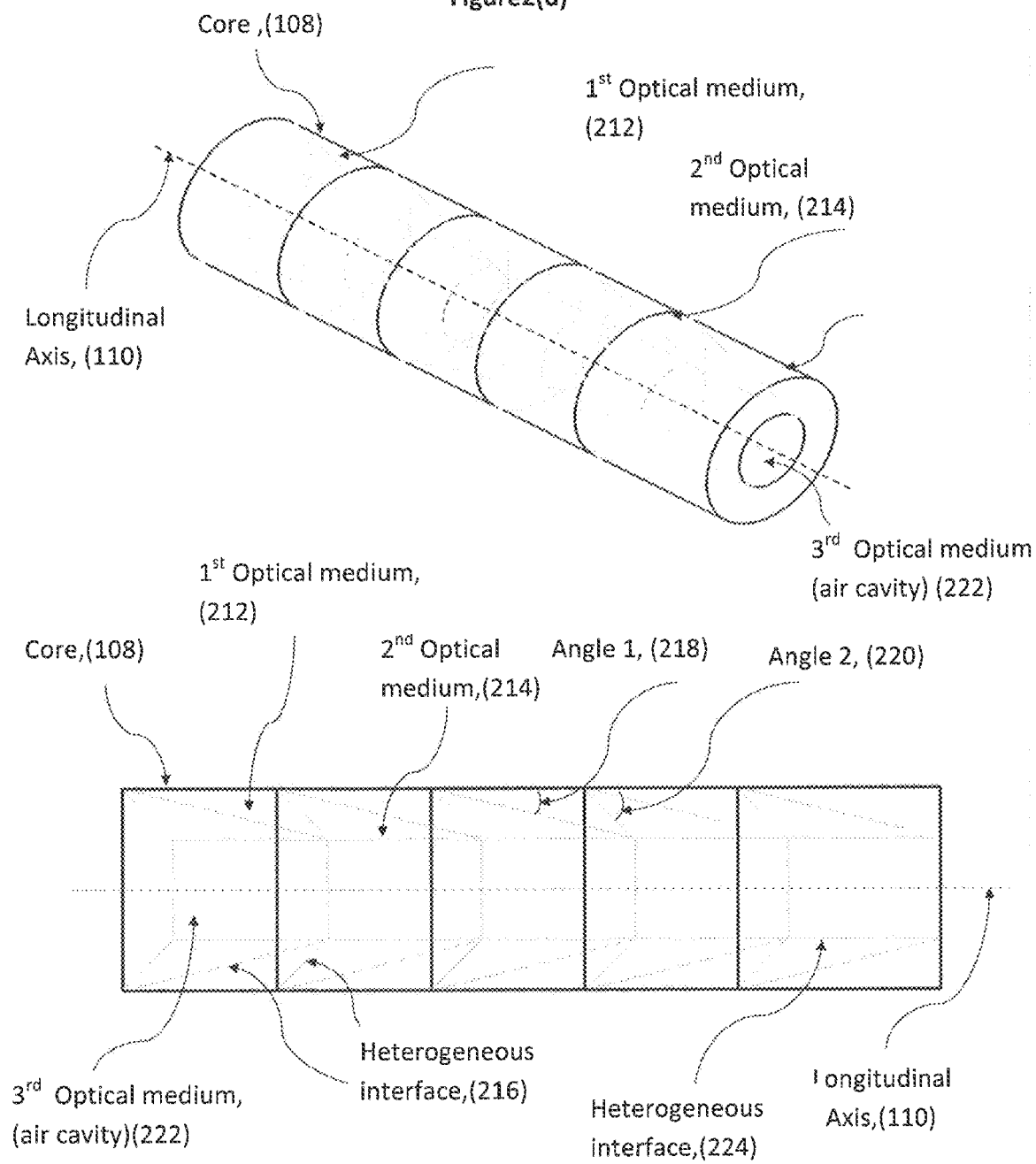

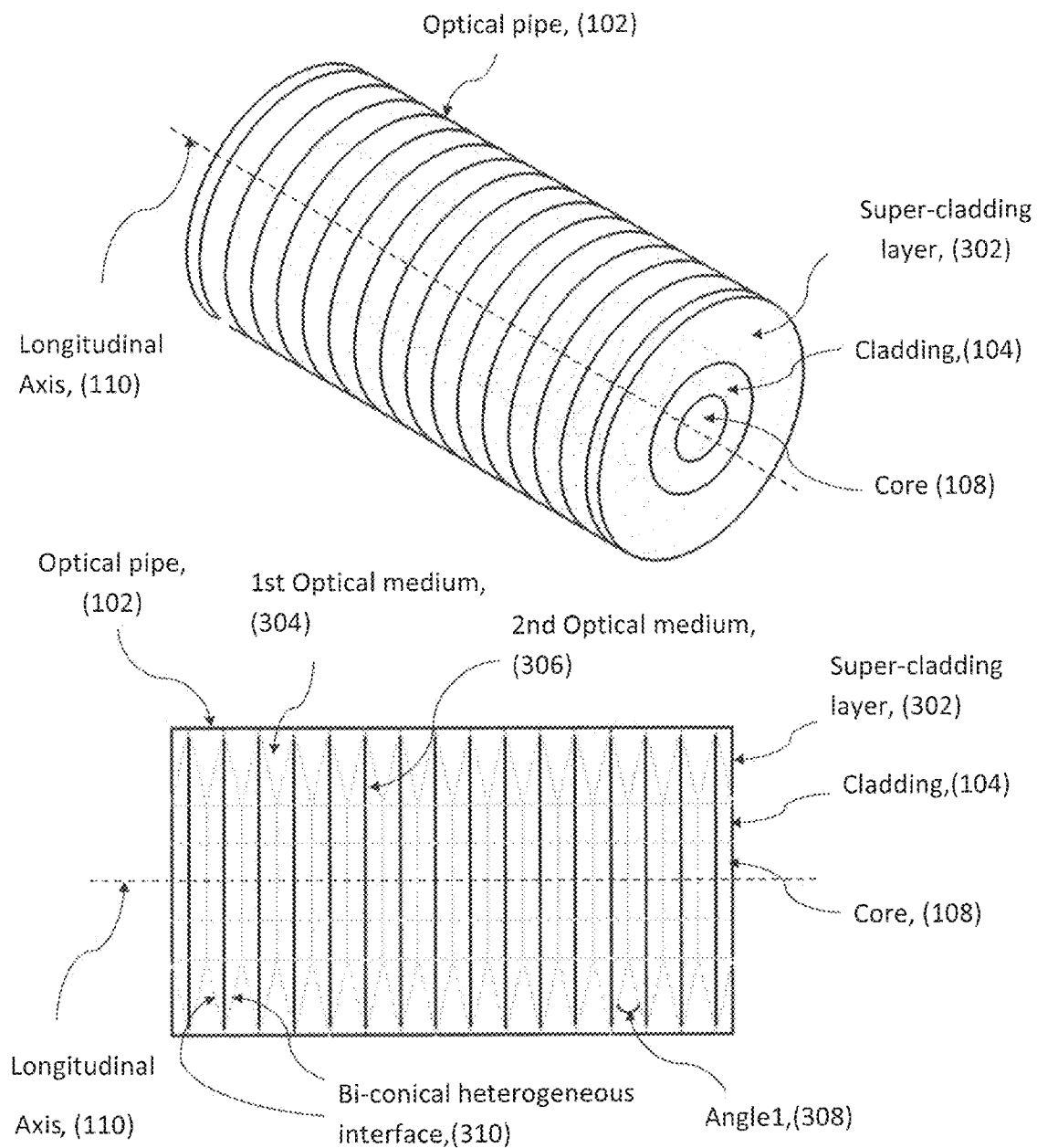

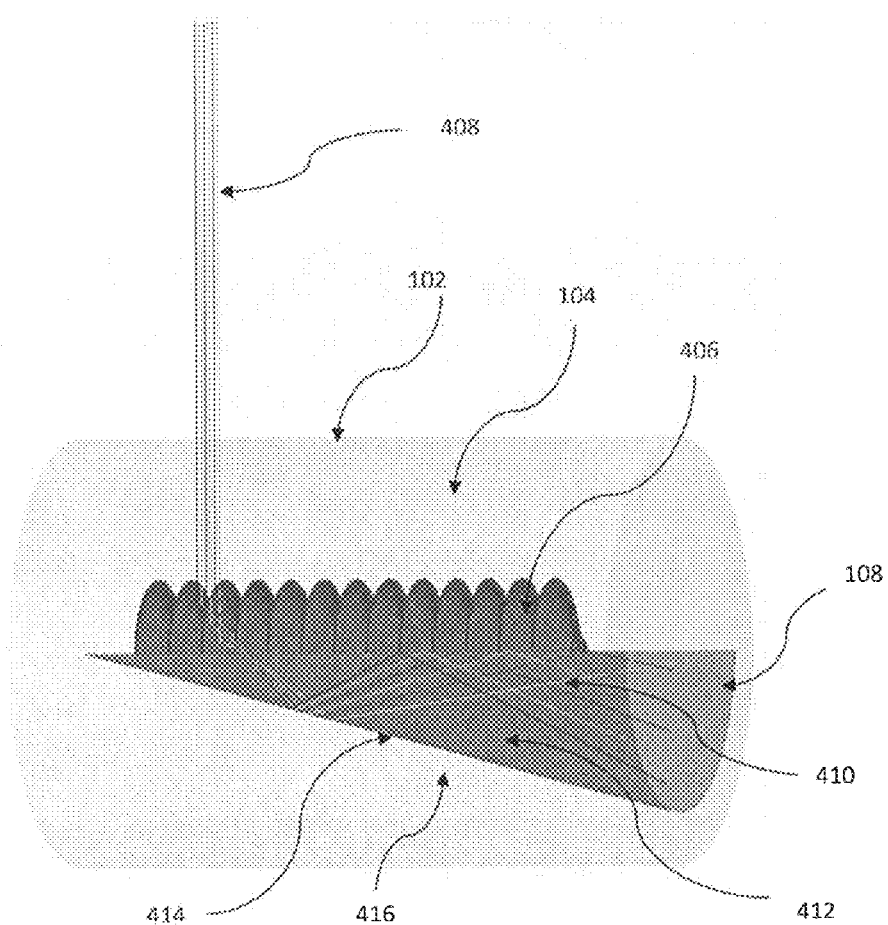

Figure 4(b) Ray traces of light in the cladding and the core at various angles of incident light
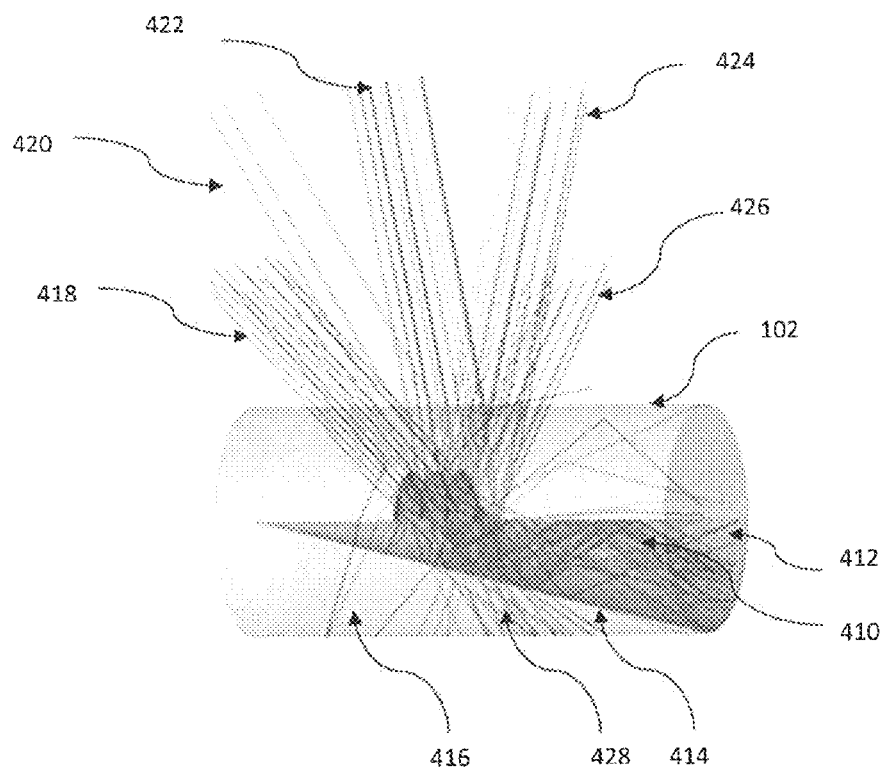

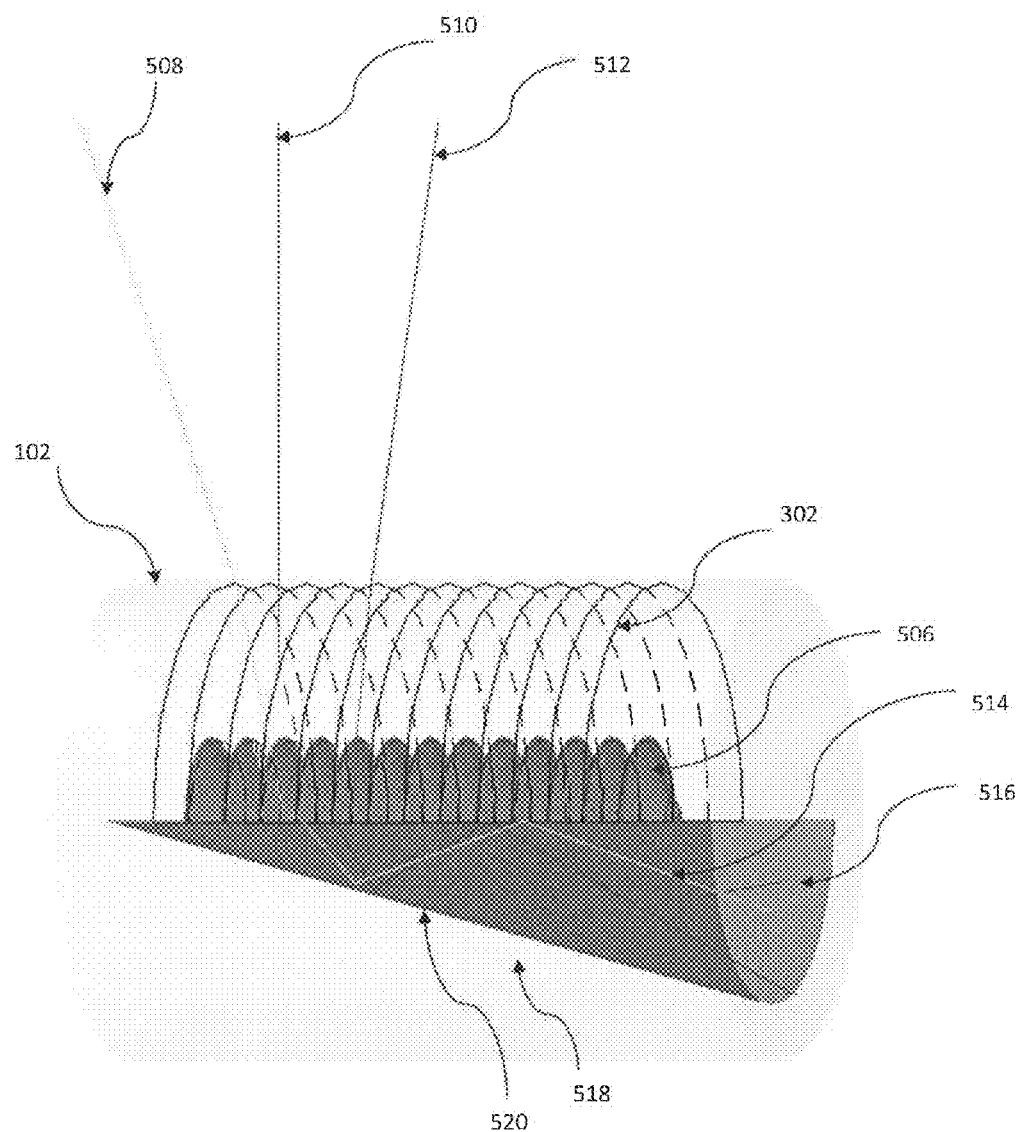
Figure 5: Ray traces of light going through the super-cladding, cladding and the core Figure 6(a) Light guiding in conical composite core over long distances
3D view (z axis = fiber axis)
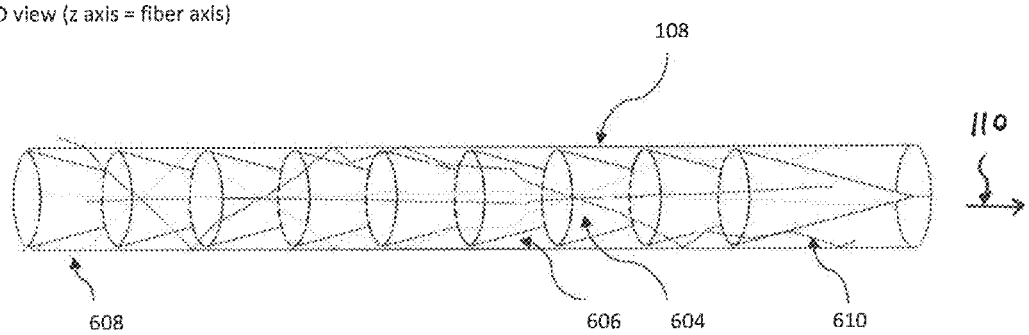
Side view – yz-plane (looking along the x-axis)
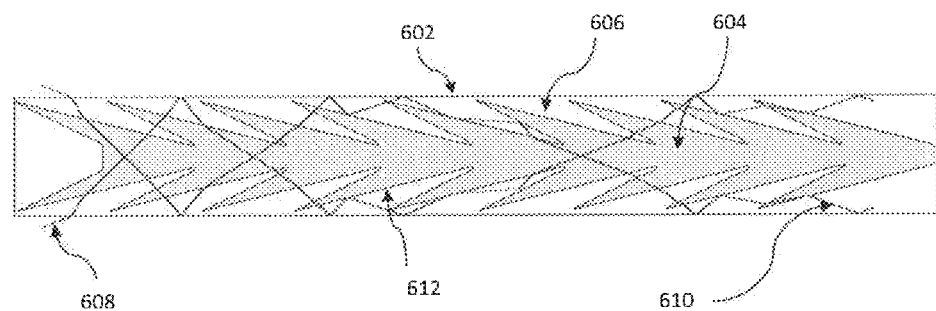
Top view – xz-plane
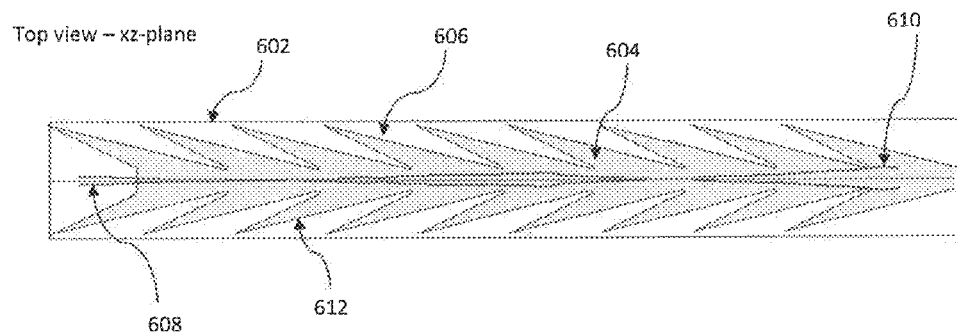

Figure 6(b) Light guiding over long distances in core with axial air cavity
Side view (xy plane)
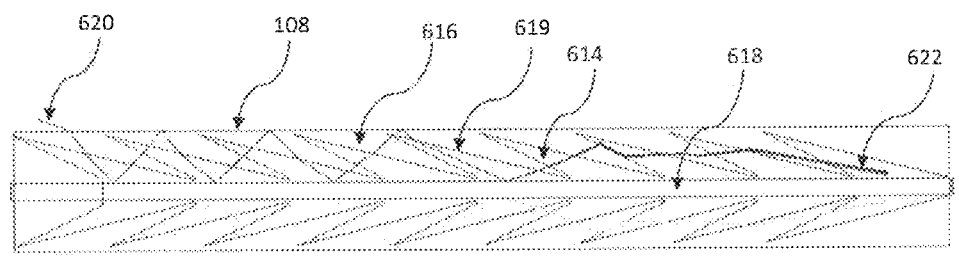
Top view (xz plane)
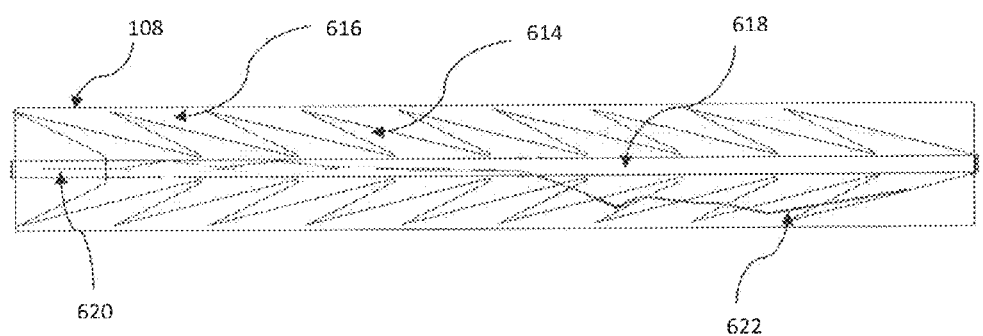

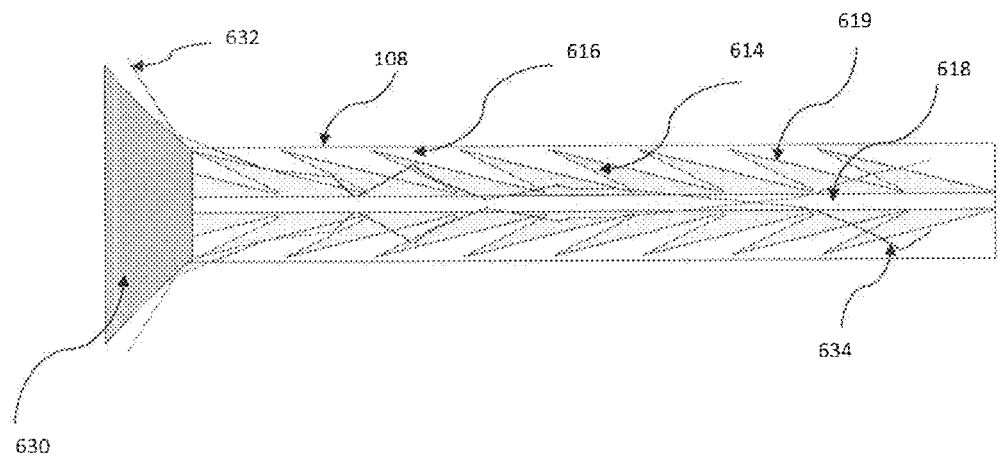
Figure 6(c) Light guiding over long distances in core after reflection from the conical inclusion in the cladding layer (top view)

Figure 7: An array of optical pipes to be used as a solar concentrator to produce electrical power using sunlight.
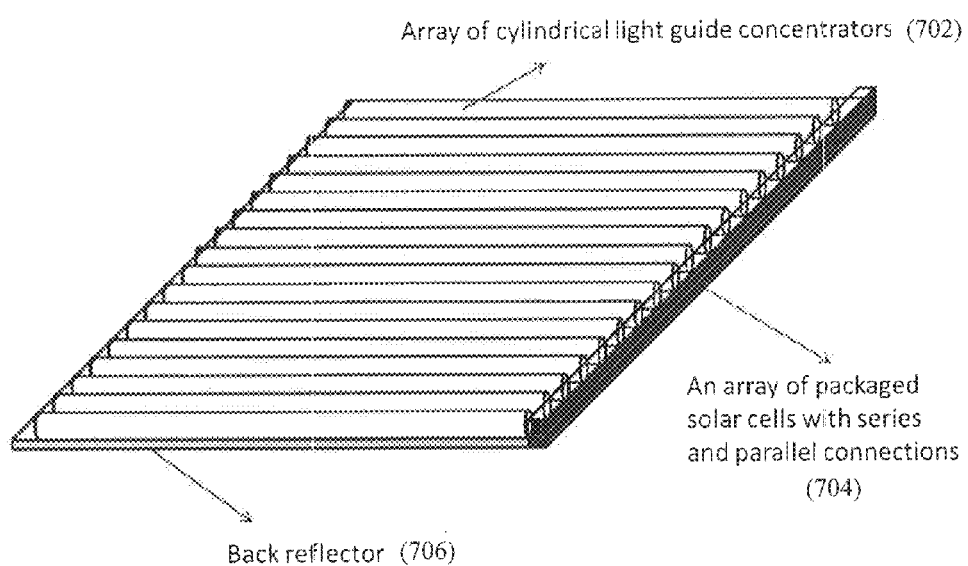

Figure 8(a) Planar light guide apparatus using an cladding consisting of an array of semi-conical inclusions and a core with global taper
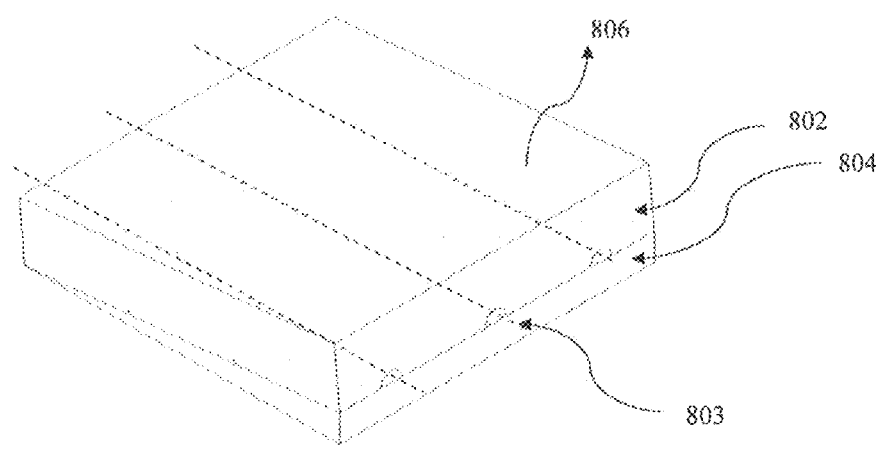

Figure 8(b) Top view cladding layer in figure 8(a)
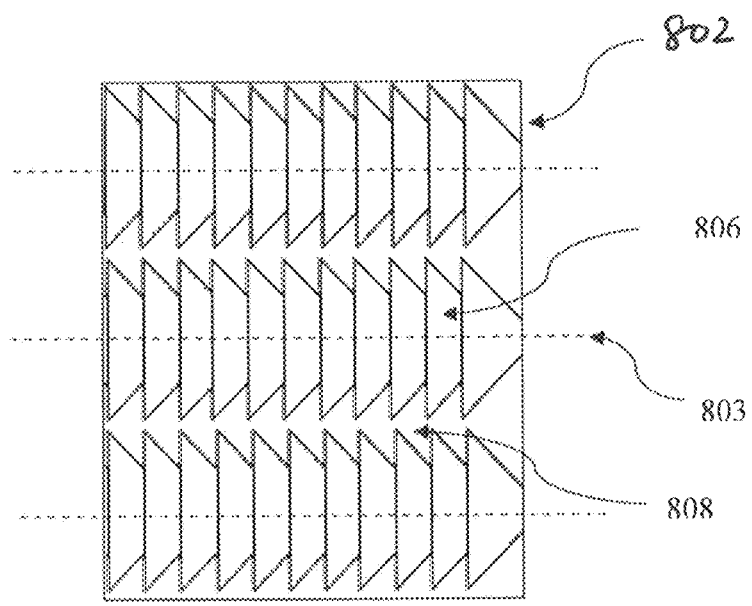

Figure 8(c) Top view of the cladding layer with the array of semi-conical inclusions in a fish scale pattern
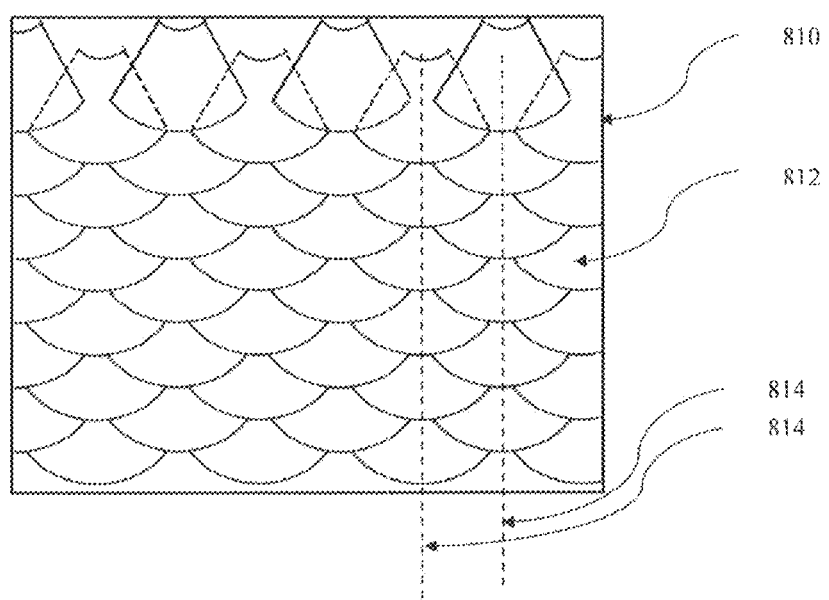

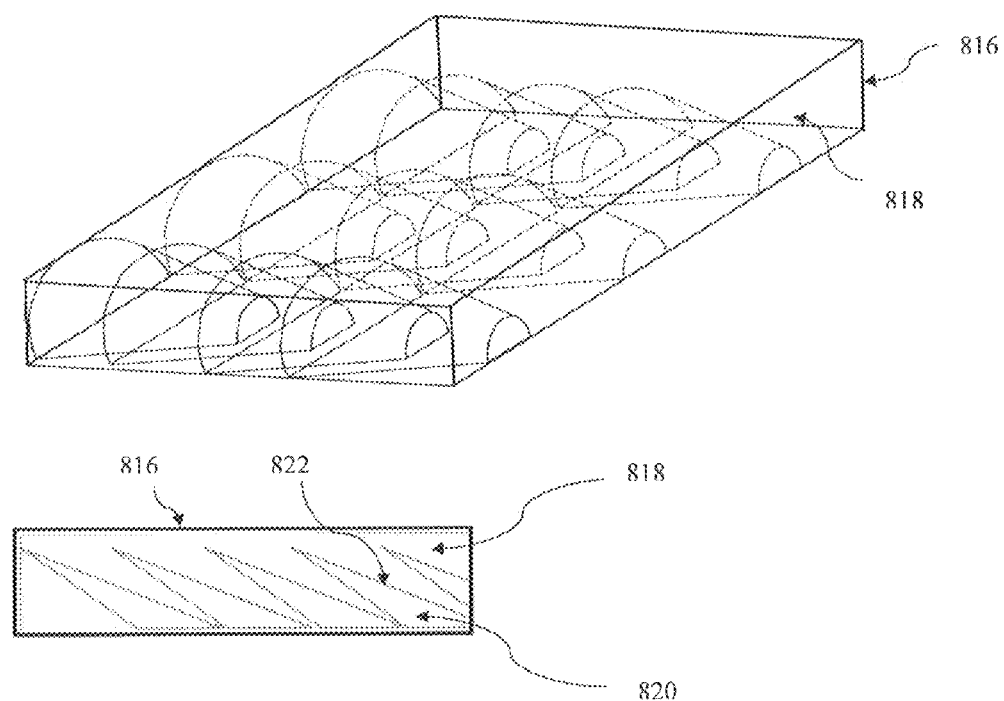
Figure 8(d) Use of planar core layer with an array of semi-conical heterogeneous interface between two optical media

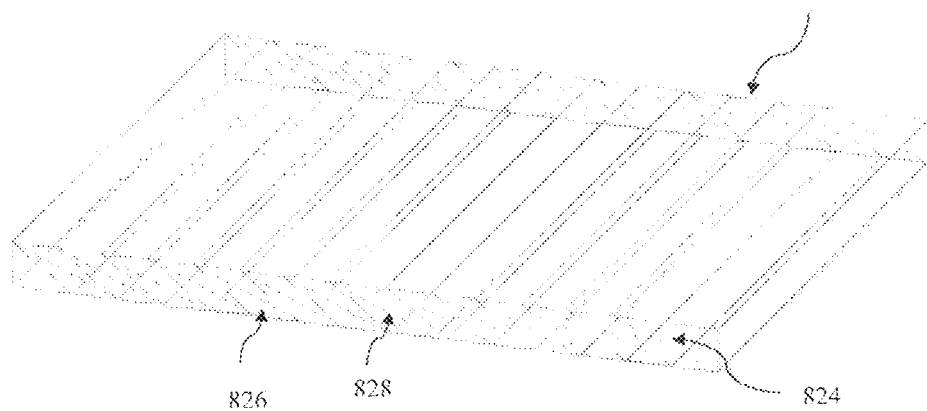
Figure 8(e) Use of planar core with array of prismatic heterogeneous interface between tow optical media

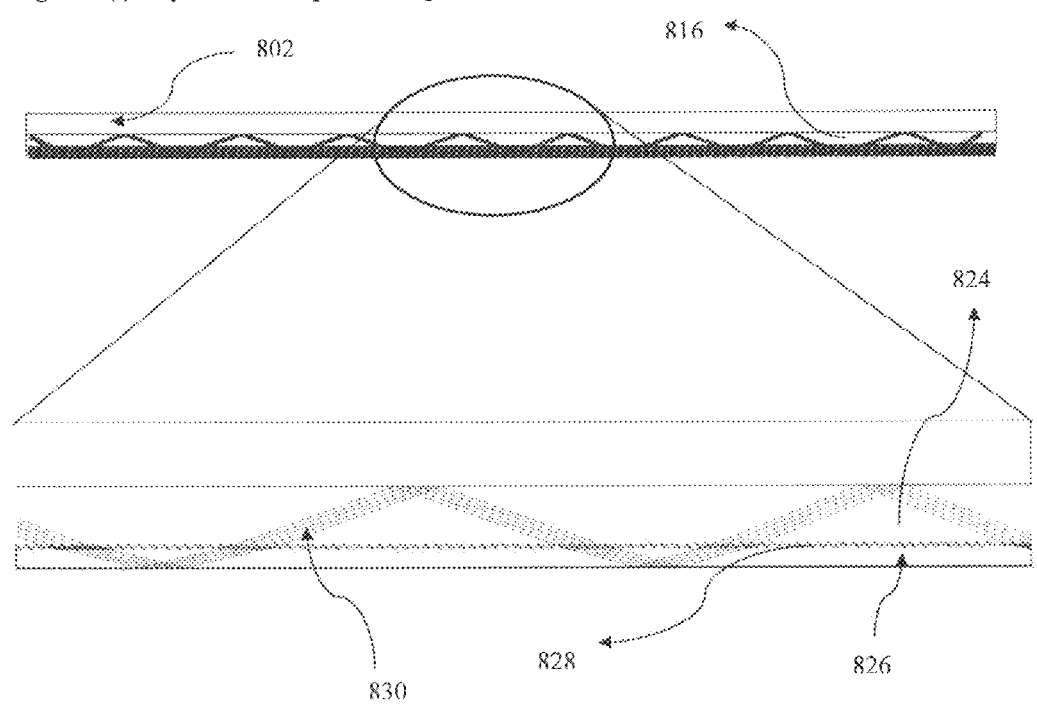
Figure 8(f) Ray traces of a prismatic planar core shown in Figure 8(e)

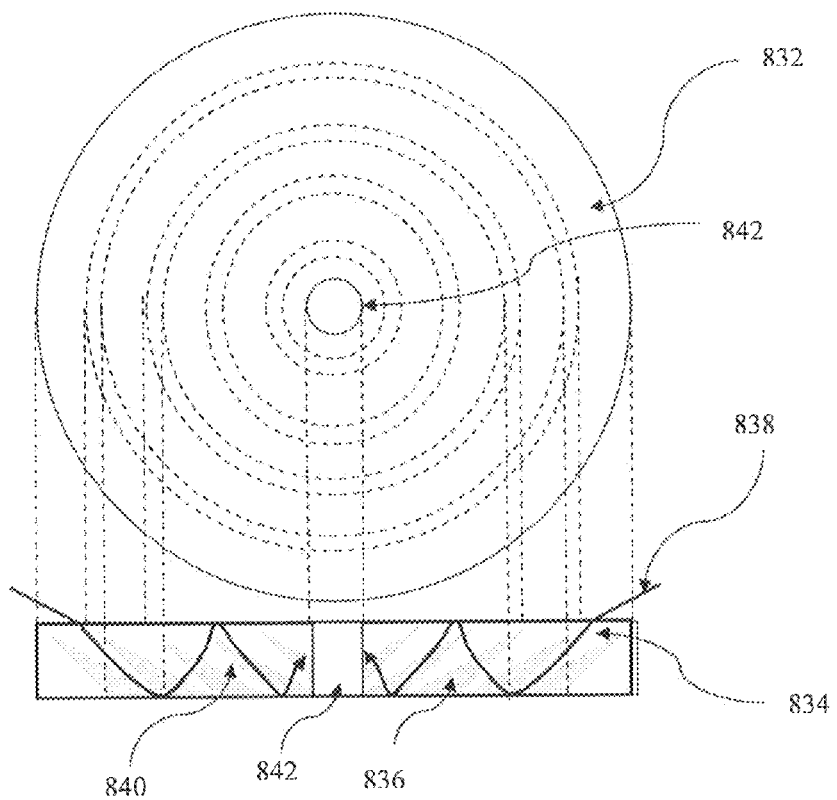
Figure 8(g) Use of a planar core in the shape of the circle

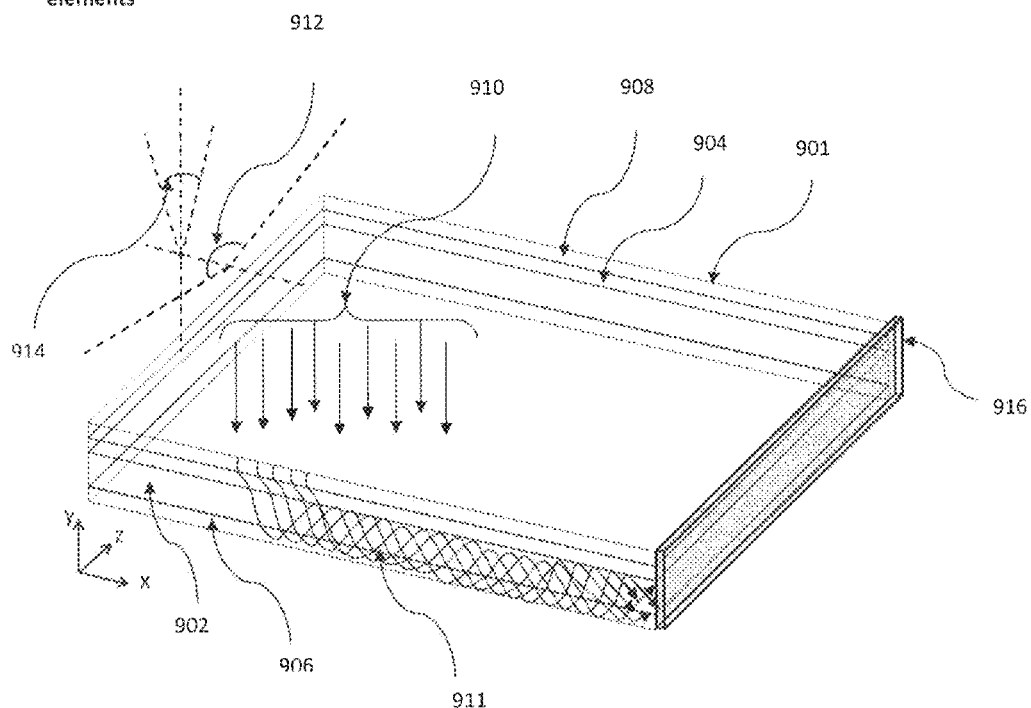
Figure 9(a) A Planar light guide concentrator using array of cladding, core and super-cladding elements

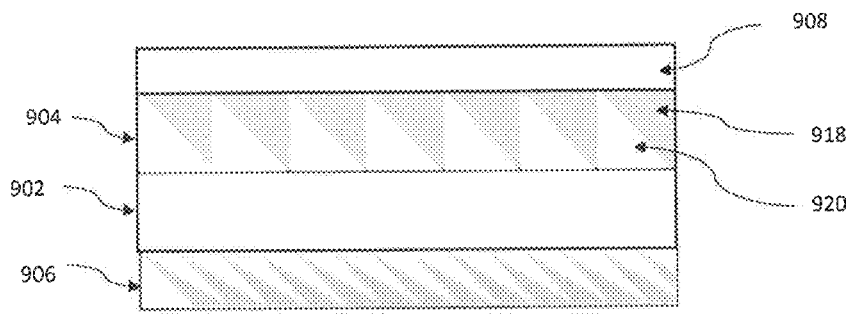
Figure9(b) 2D cross-section of planar waveguide using a planar supercladding layer, a planar cladding layer and high refractive index glass and planar composite core

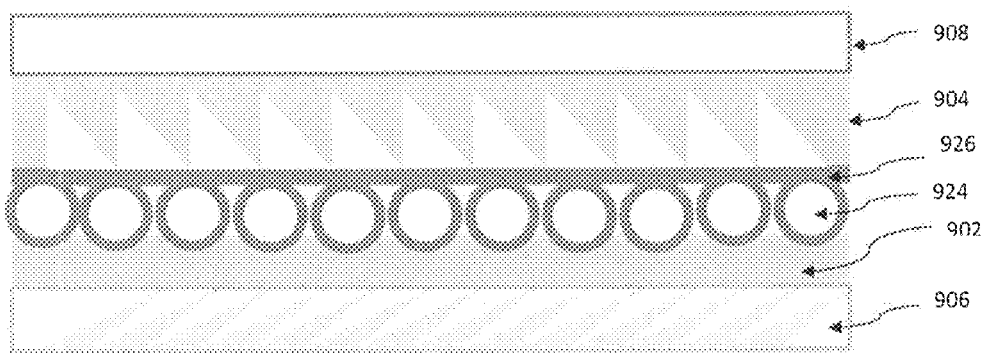
Figure 9(c): A design variation to the planar light guide concentrator with layer of whispering gallery mode microcapillary ring resonators in between the cladding and the core Figure 9(d) Design variation of the supercladding layer for the planar concentrator
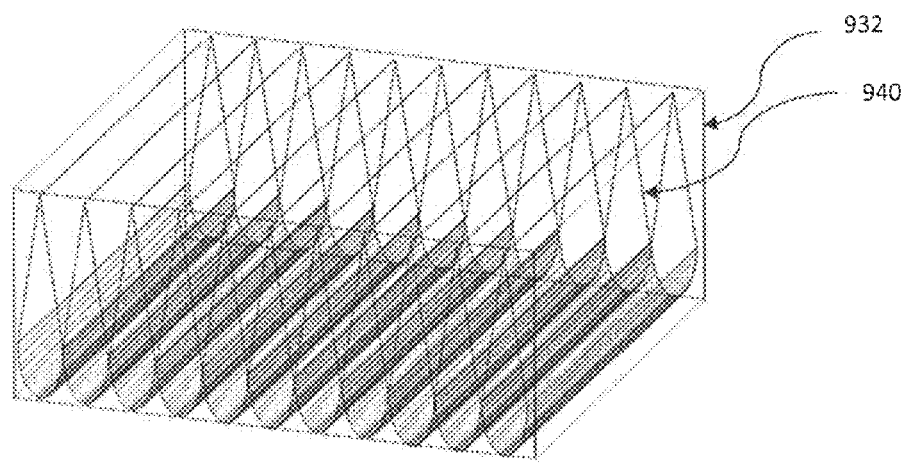
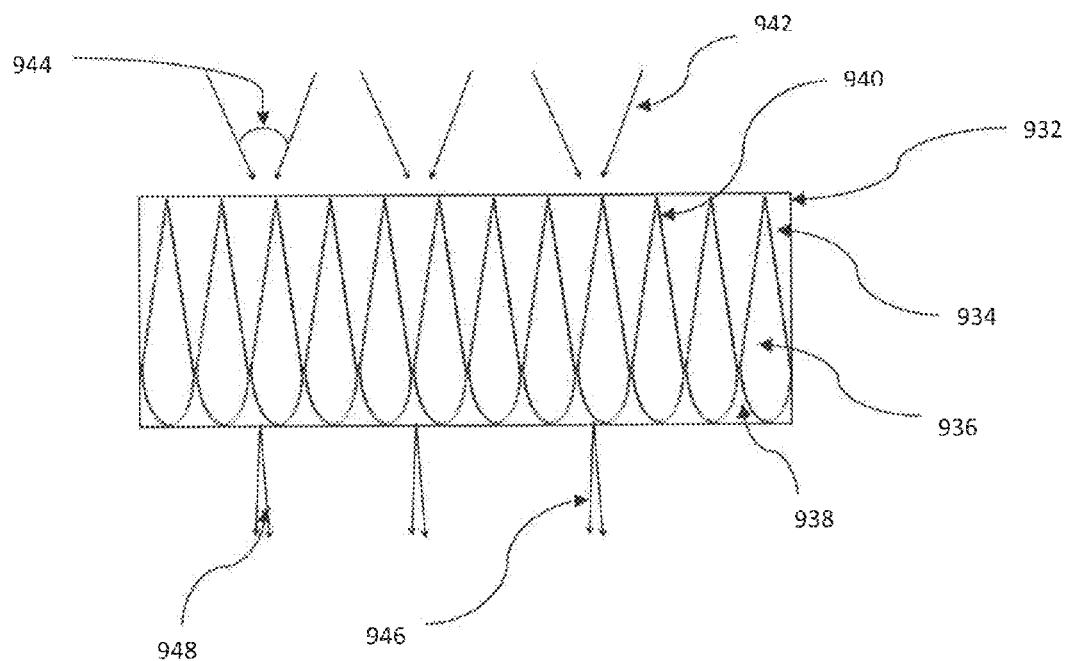

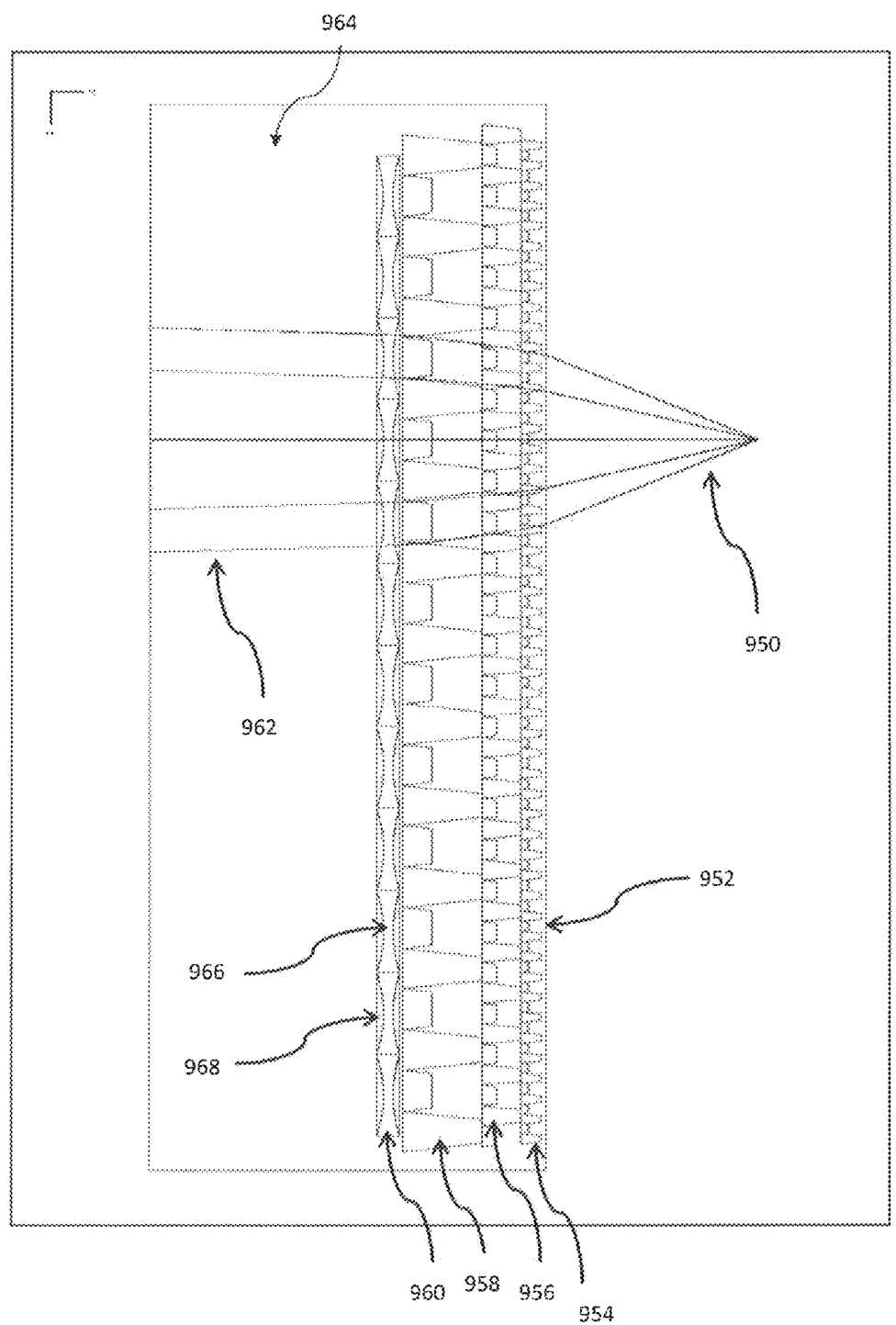
Figure 9(e) Alternative design of Supercladding layer

Figure 9(f) Plot showing the angular variation of the output rays after going through the super-cladding layer shown in figure 9(e)
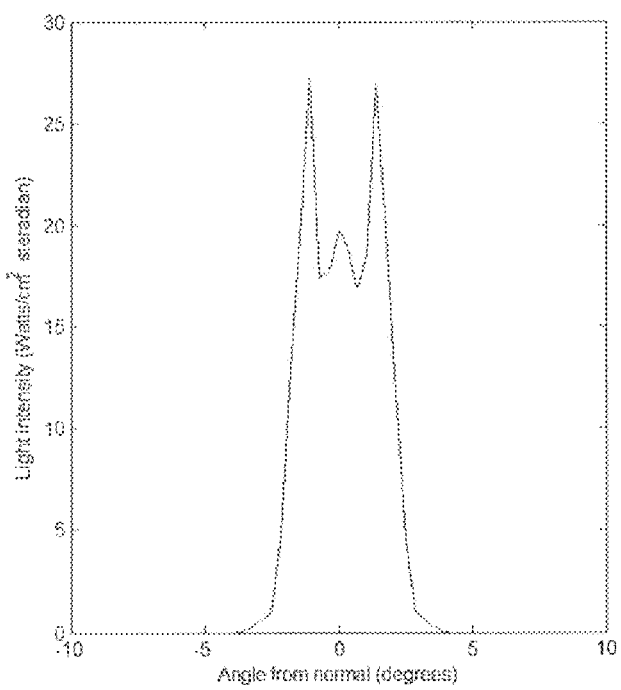

Figure 10(a). Rules for Materials Selection in our light guide apparatus
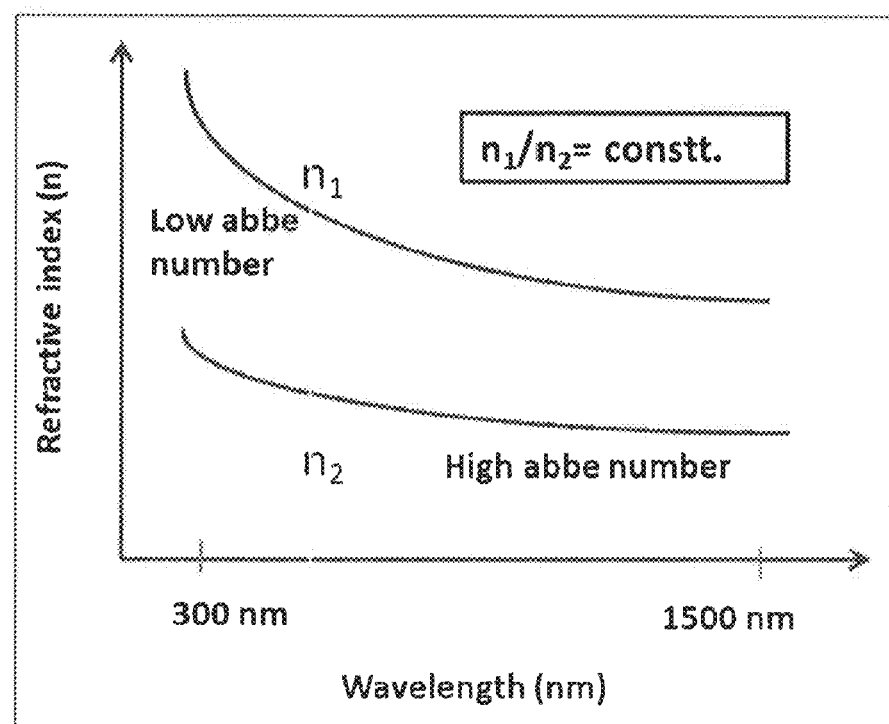

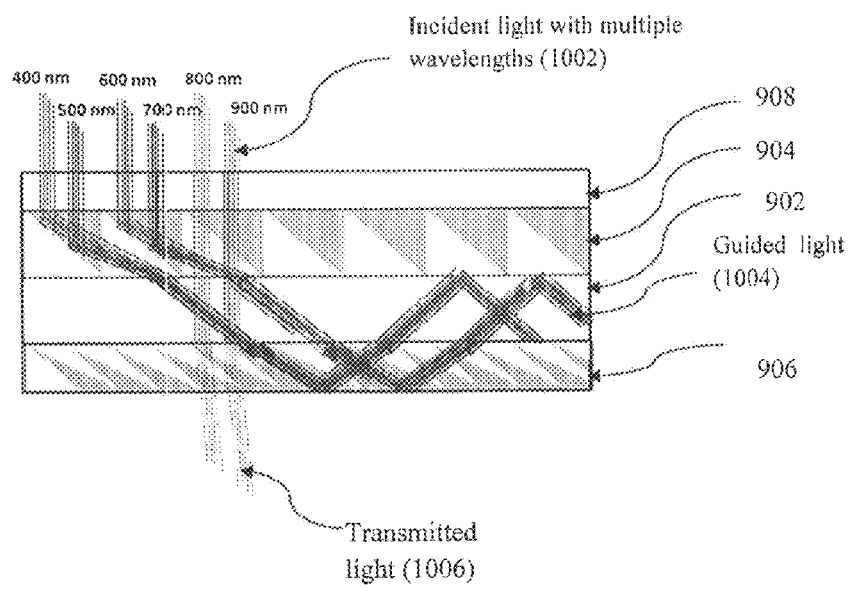
Figure 10(b). Spectral selection in our light guide apparatus using right combination of materials and angles of heterogeneous interfaces Figure 10(c). Data on light guiding performance for a device with spectral selection made using a predetermined material combination
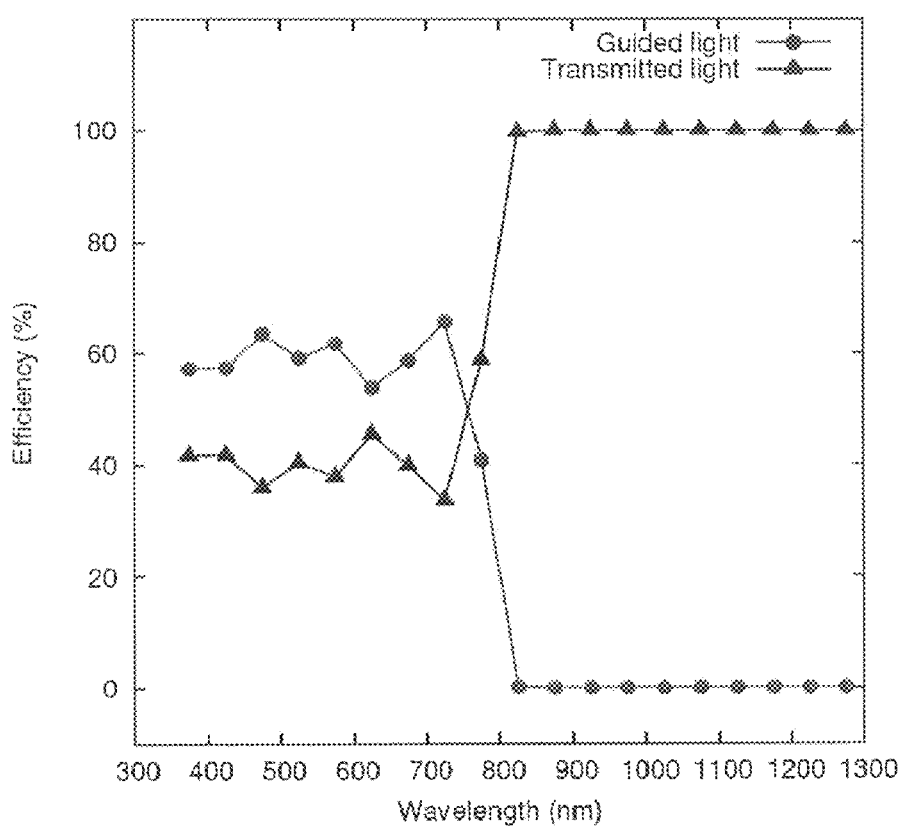

Figure 11(a). Assembly method to prepare planar sheets with air inclusions in a particular design
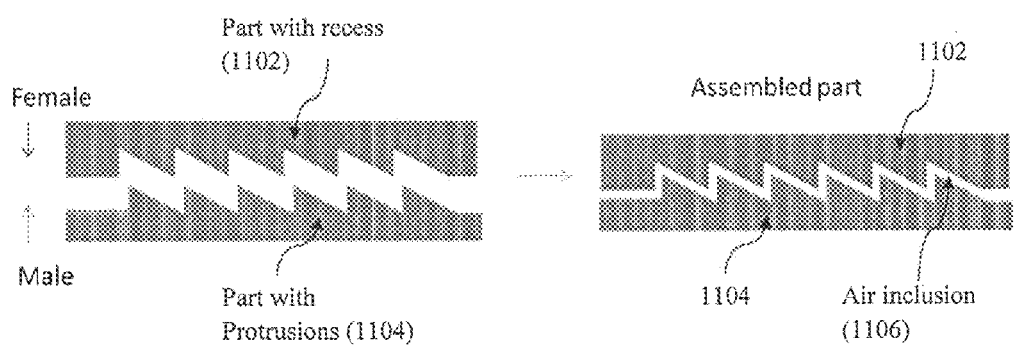

Figure 11(b). Fabrication method for layers with heterogeneous interfaces between two materials
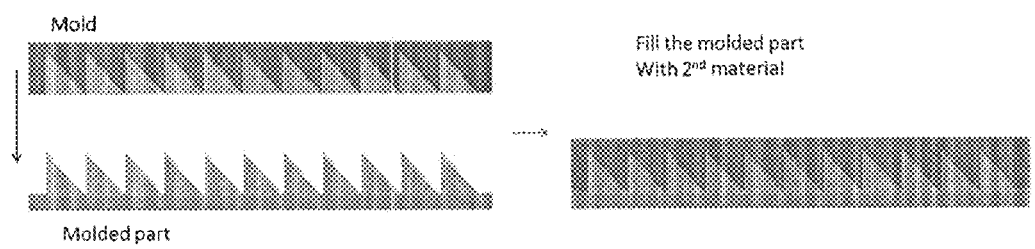

Figure 11(c). Fabrication method
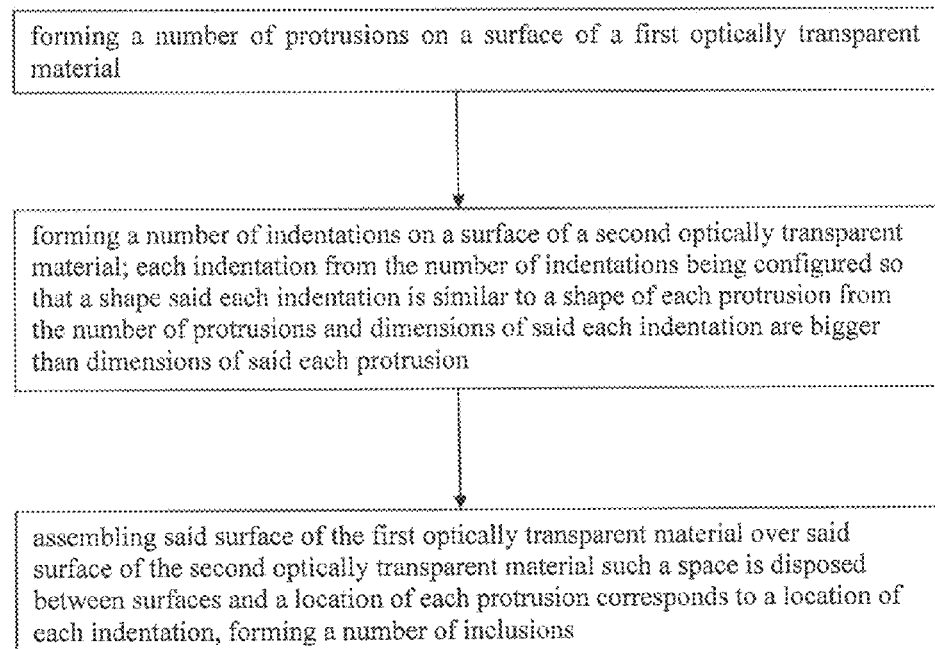

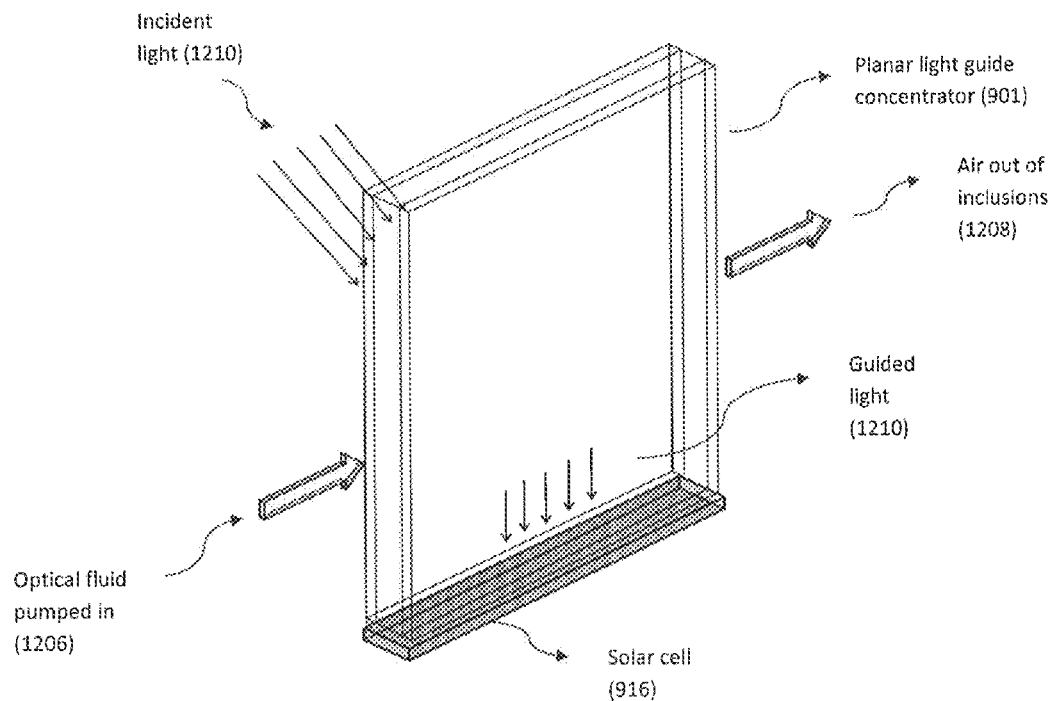
Figure 12(a). Use of the light guide apparatus as described in this disclosure as a smart window device

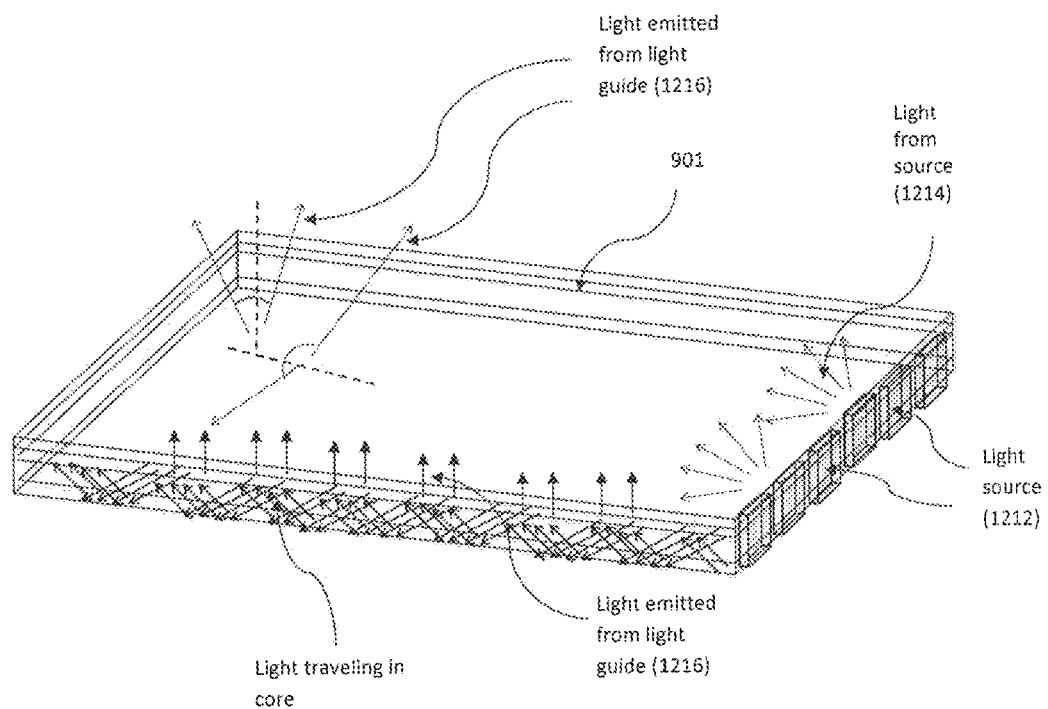
Figure 12(b). Use of light guide apparatus as described in this invention as a lighting device

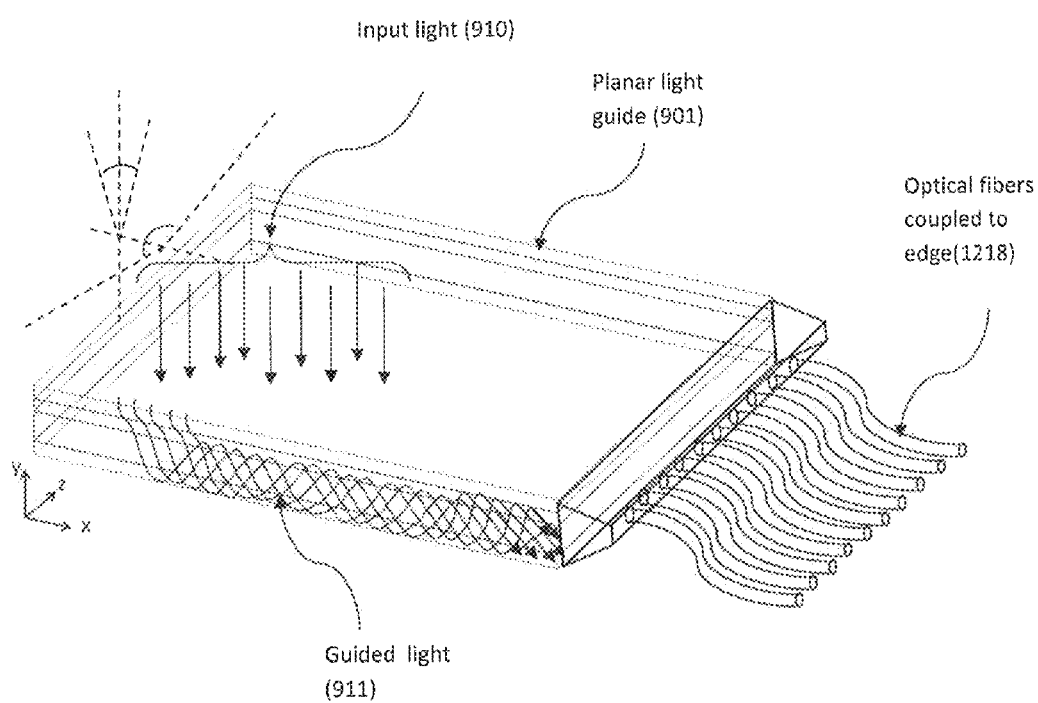
Figure 12(c). Use of light guide apparatus as described in this disclosure as an optical collector for indoor lighting

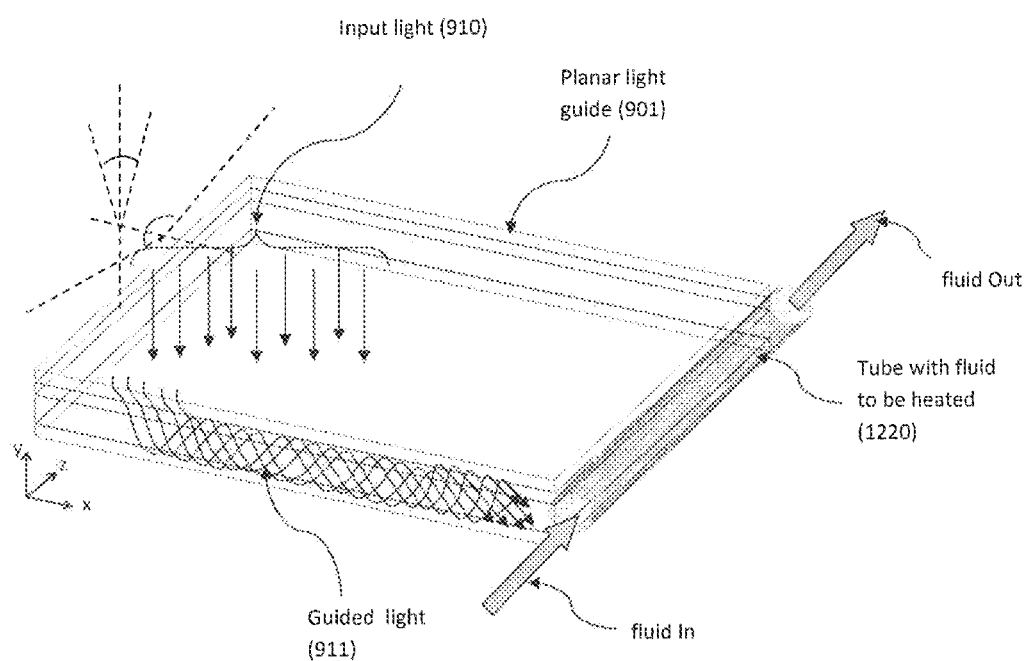
Figure 12(d). Use of light guide apparatus as described in this disclosure as a Solar Thermal Device Figure 12(e). Use of some embodiments of the light guide apparatus as optical laminates on photovoltaic devices and modules for light trapping
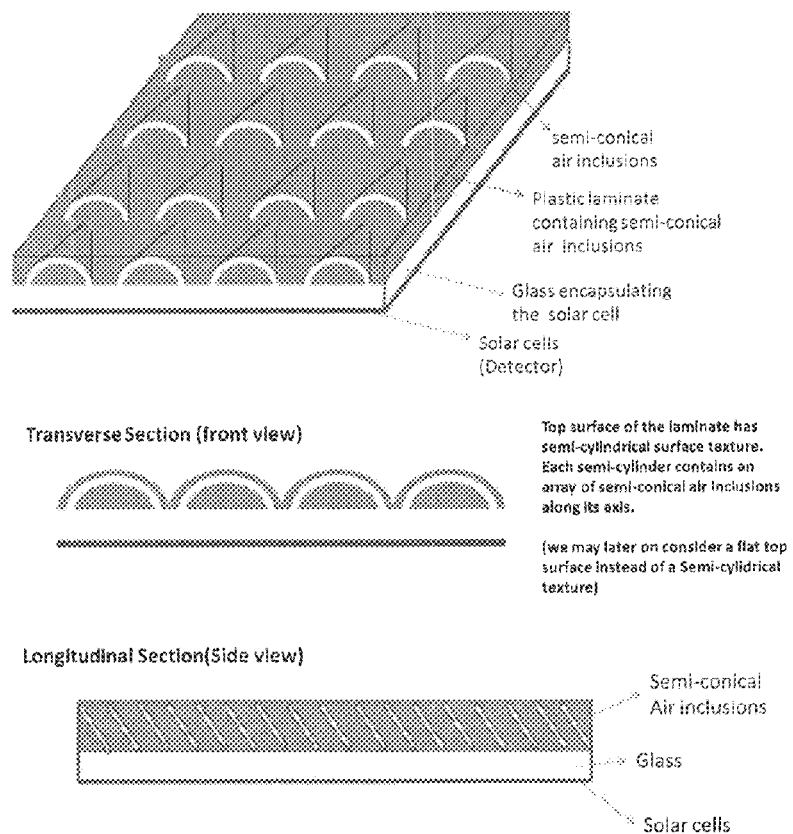

Figure 12(f). Use of some embodiments of light guide apparatus as trapping optics for luminescent concentrators
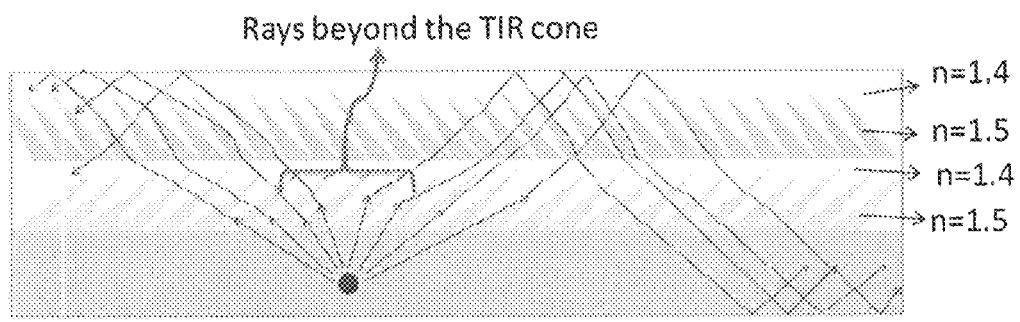

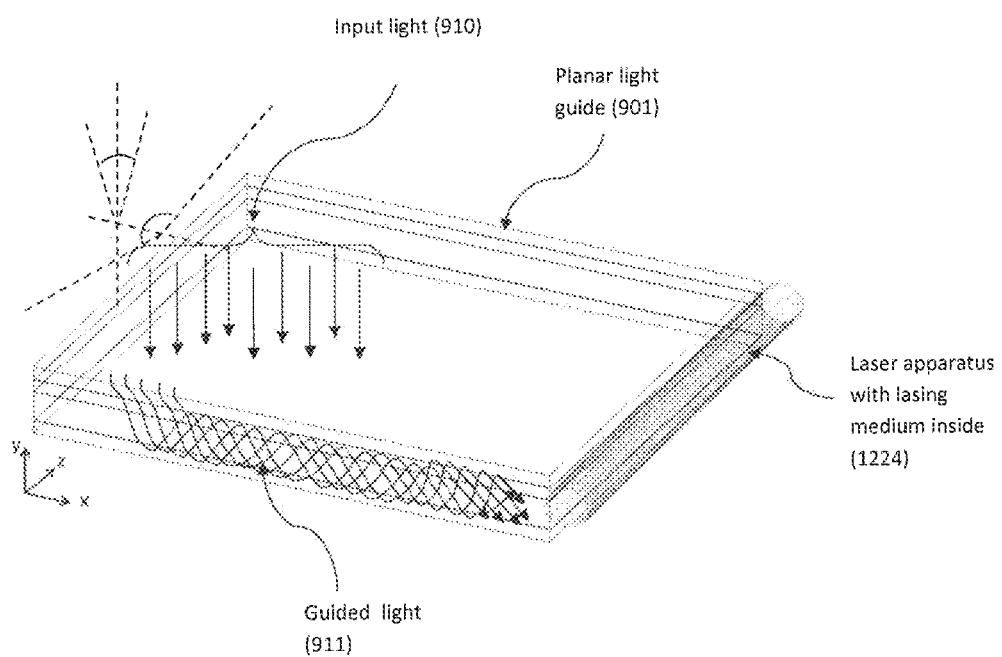
Figure 12(g) : Use of light guide apparatus as described in this disclosure as an optical input for optical pumping of lasers

LIGHT GUIDE APPARATUS AND FABRICATION METHOD THEREOF

CROSS REFERENCE TO RELATED APPLICATIONS

This application claims priority of U.S. Provisional Application Ser. No. 61/749,168, filed Jan. 4, 2013, entitled UNIQUE METHOD TO GUIDE LIGHT INTO A CYLINDRICAL TUBE AND ITS USE IN MAKING SOLAR CONCENTRATOR, which is incorporated by reference herein in its entirety for all purposes.

BACKGROUND

The present teachings relate to a light guide apparatus and a fabrication method thereof. More particularly, the present teachings relate to a light guide apparatus for collecting light and delivering the collected light, and a fabrication method thereof.

Light guide apparatuses, such as light pipes and optical fibers, have been used to redirect the propagation of light beams using the principle of wave-guiding. Light pipes need to have the light pumped into them from the end of the pipe or fiber with the condition that angle of light falls within the acceptance cone of the fiber to be guided therein. Light guide apparatuses, such as solar concentrators, have also been used to focus light in a small area. However, solar concentrators require a tracking system, because they only work at certain fixed angle of the sun relative to the solar concentrators. Moreover, many of these light guide apparatuses are rather bulky. Accordingly, there is a need to develop a new light guide apparatus that car concentrate light without using a tracking system. There is also a need for a new light guide apparatus that can redirect light impinging on the apparatus over a wide range of incident angles.

SUMMARY

A light guide apparatus that can redirect light impinging on the apparatus over a wide range of incident angles and can concentrate light without using a tracking system and methods for fabrication are disclosed hereinbelow.

In one aspect, the present disclosure provides a light guide apparatus having a core that defines a longitudinal axis. The core includes a first optically transparent section comprising a first optical medium having a first index of refraction; and a second optically transparent section comprising a second optical medium having a second index of refraction, an interface between the first optically transparent section and the second optically transparent section defining a shape. The shape, the first index of refraction, and the second index of refraction are configured such that light entering the core is deflected at the interface at an angle such that, when the light impinges on a core-cladding interface, the light impinges on the core cladding interface at an angle at least equal to a critical angle for total internal reflection.

In one embodiment, the shape comprises a first frustum of a first half angle, wherein a central axis of the first conical frustum substantially coincides with the longitudinal axis of the core.

In one embodiment, the core further comprises a third optically transparent section comprising a third optical medium, the third optically transparent section interfacing with the second optically transparent section to define a central cylinder. The third optical medium may be air or vacuum. The second optical medium may be same as the third optical medium.

In one embodiment, the shape further comprises a second conical frustum of a second half angle, a central axis of the second conical frustum substantially coinciding with the longitudinal axis of the core. The second half angle is greater than the first half angle. A bottom base circumference of the first conical frustum coincides with a bottom base circumference of the second conical frustum. A top base circumference of the first and second conical frustums substantially coincides with a curvilinear side surface of the central cylinder. A bottom base circumference of the first conical frustum substantially coincides with a bottom base circumference of the second conical frustum.

In one embodiment, the first half angle ranges from about 0.05 degrees to about 50 degrees, and the second half angle ranges from about 2 degrees to about 80 degrees.

In one embodiment, the second frustum comprises a semicircular conical frustum, and the first conical frustum comprises a semicircular conical frustum.

In one embodiment, the first refractive index of the first optical medium ranges from about 1.4 to about 2.2, and the second refractive index of the second optical medium ranges from about 1.3 to about 2.0.

In one embodiment, the shape comprises a plurality of first conical frustums of the first half angle and a plurality of second conical frustums of the second half angle, wherein central axes of the first and second conical frustums substantially coincide with the longitudinal axis of the core. One of the first conical frustums comprises a top base circumference that coincides with a top base circumference of a neighboring one of the second conical frustums.

In one aspect, the present disclosure provides a light guide apparatus comprising a core defining a longitudinal axis; and a cladding layer on the core. The cladding layer comprises a first optical medium having a first index of refraction and an inclusion structure embedded in the optical medium. The inclusion structure comprises a second optical medium having a second index of refraction. The inclusion structure defines an interface between the first optical medium and the second optical medium. The inclusion structure, the first index of refraction, and the second index of refraction are configured such that light incident on the interface is totally internally reflected and propagates at a predetermined grazing angle with respect to the longitudinal axis. The light is incident on the cladding layering a predetermined range of angles from a normal direction substantially perpendicular to the longitudinal axis.

In one embodiment, the interface has one of a conic shape, a semi-conic shape, a parabolic conic shape, and an ellipsoidal shape. Surfaces of the inclusion structure may be textured, and the second optical medium may be air. The inclusion structure may have a semi-conic shape. The core may have a semi-cylindrical shape, and the core may be tapered.

In one embodiment, a cross section of the cladding layer has an outer circumference of a shape selected from the group consisting of a circle, an N-sided polygon, an ellipse, a semicircle, and a bounded shape of two circular arcs, wherein N is a natural number ranging from 3 to 100. In one embodiment, the first refractive index of the first optical medium of the cladding layer ranges from about 1.3 to about 1.8.

In one embodiment, the core comprises at least an optically transparent medium, and a refractive index of the optically transparent medium of the cylindrical core is greater than that of the first optical medium of the cladding layer.

In one embodiment, the core comprises a first optically transparent section comprising a third optical medium having a third index of refraction; and a second optically transparent section comprising a fourth optical medium having a fourth index of refraction; an interface between the third optically transparent section and the optically fourth transparent section defining a shape; the shape, the third index of refraction and the fourth index of refraction being configured such that light entering the core is deflected at the interface at an angle such that, when the light impinges on a core-cladding interface, the light impinges on the core cladding interface at an angle at least equal to a critical angle for total internal reflection.

In one embodiment, the shape comprises a first conical frustum of a first half angle, wherein a central axis of the first conical frustum substantially coincides with the longitudinal axis of the cylindrical core. The cylindrical core further comprises a third transparent section comprising a third optical medium, the third transparent section interfacing with the second transparent section to define a central cylinder. The shape further comprises a second conical frustum of a second half angle, a central axis of the second conical frustum substantially coinciding with the longitudinal axis of the cylindrical core.

In one aspect, the present disclosure provides a light guide apparatus comprising a core defining a longitudinal axis, a cladding layer on the core, and a super-cladding layer on the cladding layer. The cladding layer is configured to deflect light incident on the cladding layer, the light being incident on the cladding layer in a predetermined range of angles from a normal direction substantially perpendicular to the longitudinal axis. The light is deflected to a direction that forms a grazing angle with respect to the longitudinal axis. The super-cladding layer comprises a first optically transparent medium that receives incident light. A second optically transparent medium interfaces with the first optically transparent medium to define a heterogeneous interface. The heterogeneous interface comprises a plurality of bi-conic shapes.

In one aspect, the present disclosure provides a light guide apparatus comprising a super-cladding layer, wherein the super-cladding layer comprises a first optically transparent medium that receives incident light; and a second optically transparent medium interfacing with the first optically transparent medium to define a heterogeneous interface, wherein the heterogeneous interface comprises a plurality of shapes; each shape from the plurality of shapes configured to deflect a light beam, incident on the super-cladding layer in a first predetermined range of angles from a normal direction substantially perpendicular to a longitudinal axis, into a second predetermined range of angles.

In one embodiment, the light guide apparatus further comprises a core defining the longitudinal axis; a cladding layer disposed on the core, wherein the cladding layer is configured to deflect light incident on the cladding layer, the light being incident in said second predetermined range of angles from a normal direction substantially perpendicular to the longitudinal axis; the light being deflected to a direction that forms a grazing angle with respect to the longitudinal axis. The plurality of shapes comprises a plurality of bi-conic shapes; and wherein an angle subtended by surfaces of two neighboring bi-conic shapes ranges from about 2 degrees to about 30 degrees.

In one embodiment, a refractive index of the first optically transparent medium ranges from about 1.3 to about 2.2, and a refractive index of the second optically transparent medium ranges from about 1.35 to about 2.0. A refractive index difference of the first and second optically transparent media may range from about 0.02 to about 0.30. The super-cladding layer is configured to convert a light beam having an incident angle within about ±30 degrees with respect to the normal direction to a light beam having an angle within about ±5 degrees or less with respect to the normal direction.

In one embodiment, the core comprises a third optically transparent section comprising a first optical medium with a first index of refraction; and a fourth optically transparent section comprising a second optical medium with a second index of refraction; an interface between the third optically transparent section and the fourth optically transparent section defining a shape; the shape, the first index of refraction and the second index of refraction being configured such that light entering the core is deflected at the interface at an angle such that, when the light impinges on a core-cladding interface, the light impinges on the core cladding interface at an angle at least equal to a critical angle for total internal reflection.

In one embodiment, the shape comprises a first conical frustum of a first half angle, wherein a central axis of the first conical frustum substantially coincides with the longitudinal axis of the core.

In one embodiment, the cladding layer comprises a third optically transparent section having a first index of refraction and an inclusion structure embedded in the third optical medium; the inclusion structure comprising a fourth optical medium having a second index of refraction; the inclusion structure defining an interface between the third optical medium and the fourth optical medium; the inclusion structure, the first index of refraction and the second index of refraction configured such that light incident on the interface is totally internally reflected and propagates at a predetermined grazing angle with respect to the longitudinal axis; the light being incident in a predetermined range of angles from a normal direction substantially perpendicular to the longitudinal axis. The grazing angle may range from about 0.5 degrees to about 35 degrees.

In one aspect, the present disclosure provides a solar panel comprising a light guide apparatus for receiving sun light, the light guide apparatus comprising a plurality of parallel light pipes, and a photovoltaic cell optically coupled to an end of the parallel light pipes. Each light pipe comprises a core defining a longitudinal axis and a normal direction substantially perpendicular to the longitudinal axis; a cladding layer on the core, wherein the cladding layer is configured to convert sun light from a first predetermined range of angles (about ±5 degrees in an exemplary embodiment) with respect to the normal direction to a direction that forms a grazing angle with respect to the longitudinal axis; and a collimating layer on the cladding layer, wherein the collimating layer is configured to convert sun light from an incident angle within a second predetermined range of angles (in an exemplary embodiment about ±30 degrees) with respect to the normal direction to an angle within the first predetermined range of angles (in an exemplary embodiment, about ±5 degrees) with respect to the normal direction.

In one embodiment, the solar panel further comprises a reflector under the light guide apparatus for reflecting escaped light back to the light guide apparatus.

In one aspect, the present disclosure provides a method of fabricating a light guide assembly. The method comprises forming a number of protrusions on a surface of a first optically transparent material; forming a number of indentations on a surface of a second optically transparent material; each indentation from the number of indentations being configured so that a shape of said each indentation is similar to a shape of each protrusion from the number of protrusions and dimensions of said each indentation are bigger than dimensions of said each protrusion; and assembling said surface of the first optically transparent material over said surface of the second optically transparent material such a space is disposed between surfaces and a location of each protrusion corresponds to a location of each indentation, forming a number of inclusions. In one embodiment, air is disposed in the space between the surfaces. In one embodiment, the method further comprises depositing a layer of a third optically transparent material of a substantially constant thickness over said surface of the first optically transparent material; said substantially constant sickness configured such that a shape of said surface of the first optically transparent material, after deposition is substantially congruent with a shape of said surface of the second optically transparent material; wherein after assembling the third optically transparent material is disposed in the space between protrusions and indentations.

BRIEF DESCRIPTION OF THE DRAWINGS

The present disclosure is to be read in conjunction with the accompanying drawings, in which:

FIGS. 1(a) through 1(d) illustrate a light guide apparatus having a core and a cladding layer, in accordance with various embodiments of the present disclosure;

FIGS. 2(a) through 2(d) illustrate a light guide apparatus having a core, in accordance with various embodiments of the present disclosure;

FIG. 3 illustrates a light guide apparatus having a core, a cladding layer, and a super-cladding layer, in accordance with one embodiment of the present disclosure;

FIGS. 4(a) and 4(b) illustrate ray tracing diagrams for a light guide apparatus having a core and a cladding layer, in accordance with one embodiment of the present disclosure;

FIG. 5 illustrates a ray tracing diagram for a light guide apparatus having a core, a cladding layer, and a super-cladding layer, in accordance with one embodiment of the present disclosure;

FIGS. 6(a) through 6(c) illustrate ray tracing diagrams for a light guide apparatus having a core, in accordance with various embodiments of the present disclosure;

FIG. 7 illustrates a perspective view of a solar panel including an array of light guide apparatuses, in accordance with one embodiment of the present disclosure;

FIGS. 8(a) through 8(g) illustrate various views of systems including an array of light guide apparatuses, in accordance with various embodiments of the present disclosure;

FIGS. 9(a) through 9(f) illustrate a planar light guide apparatuses, in accordance with various embodiments of the present disclosure;

FIGS. 10(a) through 10(c) illustrate strategies for materials selection in accordance with various embodiments of the present disclosure;

FIGS. 11(a) and 11(b) illustrate a method for fabricating a light guide apparatus, in accordance with one embodiment of the present disclosure;

FIG. 11(c) is a flow chart of the method of one embodiment of the present disclosure;

FIG. 12(a) illustrates a smart window using a light guide apparatus, in accordance with one embodiment of the present disclosure;

FIG. 12(b) illustrates a lighting device using a light guide apparatus in accordance with one embodiment of the present disclosure;

FIG. 12(c) illustrates optical collectors for indoor lighting using a light guide apparatus in accordance with one embodiment of the present disclosure;

FIG. 12(d) illustrates solar thermal device using a light guide apparatus in accordance with one embodiment of the present disclosure;

FIG. 12(e) illustrates optical laminates on photovoltaic devices and modules using a light guide apparatus in accordance with one embodiment of the present disclosure;

FIG. 12(f) illustrates light trapping optics for luminescent concentrators using a light guide apparatus in accordance with one embodiment of the present disclosure; and FIG. 12(g) illustrates a device for optical pumping of lasers using a light guide apparatus in accordance with one embodiment of the present disclosure.

DETAILED DESCRIPTION

Figure 1C:
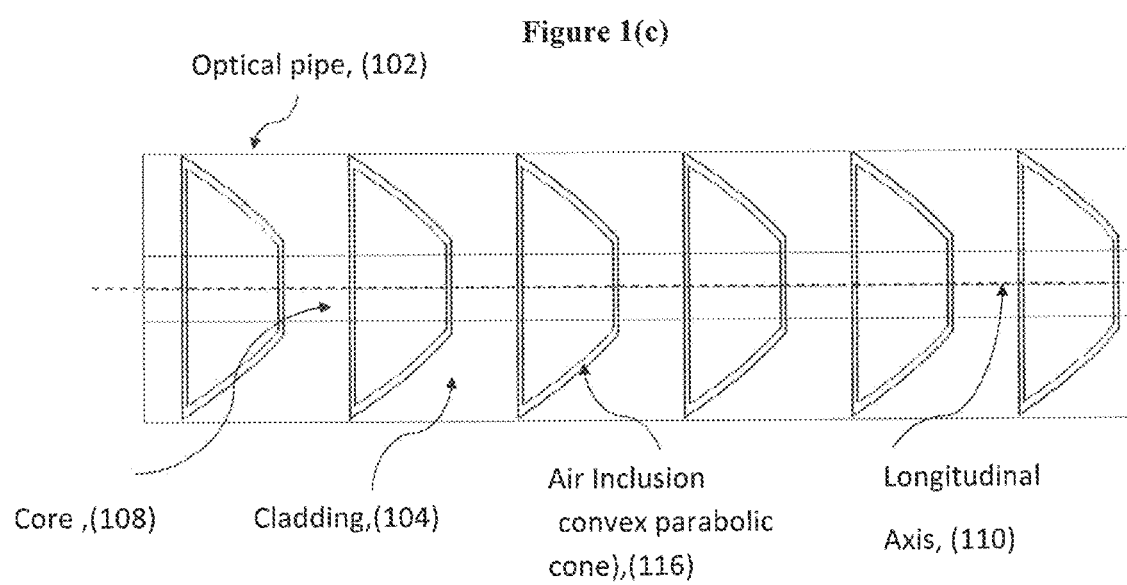

Methods and systems for collecting light into a light guide apparatus of these teachings as the light impinges on the apparatus over a wide range of angles are disclosed herein below.

In one instance, described herein includes an apparatus and a method to pump light into the light pipe from sides of the light pipe along the length of the pipe so that, for a uniform illumination over the pipe, light ends up accumulating inside the core of the pipe while traveling along the length of the pipe. This can be used to concentrate the light into core.

The following detailed description is of the best currently contemplated modes of carrying out these teachings. The description is not to be taken in a limiting sense, but is made merely for the purpose of illustrating the general principles of these teachings, since the scope of these teachings is best defined by the appended claims. Although the teachings have been described with respect to various embodiments, it should be realized these teachings are also capable of a wide variety of further and other embodiments within the spirit and scope of the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Further, any quantity modified by the term "about" or the like should be understood as encompassing a range of ±10% of that quantity.

"Light," as used herein refers to electromagnetic radiation and is not limited to only the visible range of wavelengths.

The terms "light pipe," "optical fiber," and "optical pipe" are used hereinbelow to describe the light guide apparatus of the present disclosure and are used interchangeably herein. The term optical pipe should be taken to limit the embodiment to a particular geometry.

In one embodiment of the system of these teachings, the light is concentrated into a compact design of the light pipe by accumulating light into the cores of an array of light pipes at wide angles of incidence. This eliminates the need for solar tracking systems because the optics approach of these teachings can address the variation of angles of incidence during the day as well as during the year. Such side pumped optical pipes and planar concentrators that use the design elements of these teachings can be used for many applications such as solar panels, power producing smart windows, indoor lighting, solar thermal, etc., as described herein below.

In one or more embodiments, the light guide apparatus of these teachings includes a core defining a longitudinal axis, a cladding layer on the core, the cladding layer having a first optical medium having a first index of refraction and an inclusion structure embedded in the optical medium, the inclusion structure including a second optical medium having a second index of refraction, the inclusion structure defining an interface between the first optical medium and the second optical medium, the inclusion structure, the first index of refraction and the second index of refraction configured such that light incident on the interface is totally internally reflected and propagates at a predetermined grazing angle with respect to the longitudinal axis; the light being incident in a predetermined range of angles from a normal direction substantially perpendicular to the longitudinal axis.

In one instance, the shape of the interface is one of a conic shape, a semi-conic shape, a parabolic conic shape, and an ellipsoidal shape.

In another instance, surfaces of the inclusion structure are textured.

In yet another instance, the second optical medium is air, these teachings not being limited to only that instance.

Although in the embodiments shown below the cladding and the core are shown as cylinders, a number of other geometries are within the scope of these teachings. For instance, the cladding and the core can be one of a circle, an N-sided polygon, an ellipse, a semicircle, or a bounded shape of two circular arcs. In one embodiment, N is a natural number ranging from 3 to 100.

In still another instance, the inclusion structure has a semi-conic shape, and the core has a semi-cylindrical shape. In one embodiment, the first refractive index of the first optical medium of the cladding layer ranges from about 1.3 to about 2.2.

FIGS. 1(a) through 1(d) illustrate a light guide apparatus having a core 108 and a cladding layer 104, in accordance with various embodiments of the present disclosure. As shown in FIGS. 1(a) through 1(d), the light guide apparatus 102 (or optical pipe 102 or fiber 102) comprises a cladding layer 104 and a core 108. The general approach is to take light incident on the outer surface of the optical pipe 102 and convert the light to a grazing incidence with respect to the longitudinal axis 110 of the optical pipe 102. This grazing incident light then enter the core 108 of the fiber 102 which includes optical elements that trap and propagate the light along the length of the fiber 102 inside the core 108.

As shown in FIGS. 1(a) through 1(d), the cladding layer 104 includes a monolithic optically transparent medium with air inclusion 106 in the shape of a cone. The refractive index of this medium is between 1.3 and 1.6. The half angle of the cone is chosen to be around the critical angle for total internal reflection at the dense medium/air interface. That is, when light is incident at an angle normal to the axis 110 of the fiber 102, the light gets reflected and become grazing incident with respect to the axis 110 of optical pipe 102. A higher half-angle of the cone helps to achieve light in a wider angular range, because light at angles less than normal with respect to the axis can also be totally-internally-reflected. FIGS. 2(a) through 2(d) illustrate a light guide apparatus having a core 108, in accordance with various embodiments of the present disclosure. This core layer optics traps the light inside the core 108 and allows the light to propagate substantially without any loss.

Referring again to FIGS. 1(a) through 1(d), various elements as shown therein are described in further detail as follows.

In the embodiment shown in FIG. 1(a), a cylinder represents an optical fiber or light pipe or optical pipe 102 in which light is pumped and propagates. This structure is herein referred to as an optical pipe 102. It is to be understood that the cross-section of the cylinder A1 is not necessarily circle. Instead, the cross-section of cylinder A1 can be, for example, an n-sided polygon (where n can be between 3 and 100), or an ellipse, or a semicircle, or bounded by two arcs of a circle.

In the embodiment shown in FIG. 1(a), the optical pipe 102 has a longitudinal axis 110.

In the embodiment shown in FIG. 1(a), a line perpendicular to the central axis 110 of the optical pipe 102 provides another axis. An orthogonal co-ordinate system is used in this embodiment such that the x-axis is always oriented along the longitudinal axis 110 and y-axis is denoted as radial axis 112. The radial plane is defined as the cross-section of the optical pipe 102 and is aligned with the y-z plane. (It should be noted that this notation is not a limitation of these teachings.)

In the embodiment shown in FIG. 1(a), a cladding layer 104 of the optical pipe 102 is made of a material (optically transparent medium). In one instance, the refractive index of the optically transparent material in the cladding layer ranges from about 1.3 to about 1.8.

In the embodiment shown in FIG. 1(a), there is an inclusion 106 in the cladding layer 104 which may have a shape of a conical frustum. In the embodiment shown, the inclusion is an air inclusion, (It should be noted that other optical materials can be used for the inclusion.) It is appreciated that variations on the shape of this inclusion 106 are possible. The purpose of this cladding layer 106 is that, if any light hits the dense-material/air interface between the air inclusion 106 and the optically transparent medium of the cladding layer 104, the light undergoing total-internal-reflection becomes a grazing angle (in one embodiment, 35-0.5 degrees) with respect to the axis 110 of the optical pipe 102.

In the embodiment shown in FIG. 1(a), there is a core 108 of the optical pipe 102, which is further described below. This core layer 108 includes one or more optically transparent media arranged in a particular geometry where at least one of the media in the core 108 has an index of refraction higher than that of the cladding material. At least one of the materials in the core 108 may be a lasing medium or composed of a luminescent material with light absorbing properties.

In the embodiment shown in FIGS. 1(a)-1(b), a light ray that is incident on a side of the optical pipe 102 is incident on the optical medium-air inclusion interface at an angle higher than the critical angle for total internal reflection.

In the embodiment shown in FIGS. 1(a)-1(b), a light ray that is reflected from the optical medium-air inclusion interface is incident on the core at grazing angles (in one instance, ranging from about 35 degrees to about zero degrees).

In the embodiment shown in FIG. 1(b), the air inclusion is similar to that of FIG. 1(a). The shape of the embodiment shown in FIG. 1(b) is a parabolic conical frustum. That is, the longitudinal cross-section of the cone looks like a section of a parabola. This structure appears to be the most optimal results in terms of guiding the light with wide angular aperture into the core 102.

In the embodiment shown in FIG. 1(c), an air inclusion is shown that has a shape similar to that of FIG. 1(b). The profile of the cone of FIG. 1(c), as seen in the longitudinal cross-section, is a convex parabola. It is appreciated that various other shapes of FIG. 1(c) are possible, such as, for example, ellipsoidal.

In the embodiment shown in FIG. 1(d), an air inclusion 118 of conical shape with a textures surface 122 includes one or more textured features. The shape of the textured features may be, for example, a semi-circle, quarter circle, $1/8^{th}$ arc of a circle, etc. The textured surface 122 may also be a section of a parabolic or ellipse. Also, the top and bottom surfaces 122 and 124 can be either both concave, both convex, top convex/bottom concave, or top concave/bottom convex. These textured surfaces 122 and 124 may also include straight lines with slopes different from each other and/or different than that of the cone itself. There may be 2-10 of these textured features on the surface of one individual conical air inclusion 118. The texture of the upper surface can be different from the texture of the lower surface. In one embodiment, the textured features on surfaces 122 and 124, as a whole, may constitute an air inclusion of a spiral shape.

Further, although not shown, it is appreciated that the bottom and top surfaces of the conical air inclusion 106, 114, 116, or 118 are not parallel, such that the top surface 122 is a cone of a higher angle, whereas the bottom surface 124 is a cone of a lower angle. The profile of the each of the cone surfaces can be any of the shapes described herein above.

In addition, although not shown, it is appreciated that the angle of the bottom surface with respect to the central axis may be 90 degrees. Thus, the air inclusion 106, 114, 116, and 118 is bound by a circular base (whose plane is perpendicular to the surface of the central axis) and a conical surface. The conical surface can be of any shape as described herein above.

Moreover, it is appreciated that the air inclusions need not be air or vacuum. For example, the air inclusions may be filled with optically transparent medium of refractive index lower than that of the material of the cladding 104.

The ratio of the outer radius of the cladding layer 104 to the outer radius of the core 108 can be in the range of the refractive index of the cladding material. Thus, the ratio should be in the range of about 1.3 to about 2.0.

In one or more other embodiments, the core includes a first optically transparent section comprising a first optical medium having a first index of refraction, a second optically transparent section comprising a second optical medium having a second index of refraction, an interface between the first optically transparent section and the second optically transparent section defining a shape, the shape, the first index of refraction and the second index of refraction being configured such that light entering the core is deflected at the interface at an angle such that, when the light impinges on a core-cladding interface, the light impinges on the core cladding interface at an angle at least equal to a critical angle for total internal reflection.

Referring to FIGS. 2(a) through 2(d), various embodiments of the core in the system of these teachings are shown therein are described in further detail as follows.

One strategy behind the optical design of the core 108 of these teachings is to modify the angle of the light in the core 108 by creating asymmetric interfaces (with respect the cylindrical surfaces) between two or more heterogeneous materials. Light either gets reflected (through total-internal-reflection, TIR) or refracted at these asymmetric hetero-interfaces, such that when the light hits the cladding-core cylindrical interface again, the incident angle is more than the critical angle for total internal reflection at the cladding-core interface. The various optical elements described below (as shown in FIGS. 2(a) through 2(d)) illustrate examples of this approach. One feature of this design is that the same optics has to trap the light that enters the core 108 for the first time and then keep interacting with the trapped light multiple times during its propagation along the length of the optical pipe 102 without forcing it out of the core 108.

In the embodiment shown in FIGS. 2(a) through 2(d), the core 108 that has a cylindrical shape similar to the one described in FIGS. 1(a)-1(d), (It should be noted that this is not a limitation of these teachings. Embodiments of the cladding on the core in which the cladding of core are not cylindrical are also within the scope of these teachings.) The core 108 includes at least one optically transparent medium which has a refractive index (in the range of about 1.4 to about 2.2) that is always higher than that of the cladding medium and forms the boundary with the cladding which can be a cylindrical shape.

In one instance, the first optical medium 202 is a high index material which can be in the shape of a cone. The second optical medium 208 is an air inclusion or a material of index different than that of the first optical medium 202, which can be in the shape of a cone. The refractive index of the second optical medium 208 is preferably less than that of the first optical medium 202, such that there is a possibility of total internal reflection at the interface between the first optical medium 202 and the second optical medium 208. The half angle of the interface is in the range of about 0.05 degrees to about 20 degrees. The half angle is chosen to be lower if the light incident on the core 108 from cladding 104 is at a shallow angle. A higher angle of the interface can guide light into the core 108 even when the incidence angle of the light is shallower. Therefore, somewhat higher angle in the range of 5-20 degree is preferable.

When the angle of the conical interface is steep, the heterogeneous interface boundary 206 is reduced to a point too quickly. Accordingly, the interface boundary can include repetition of the conical interface 206 between the two heterogeneous materials along the length of the optical pipe so that the light can keep propagating, as shown in FIG. 2(c).

Referring to FIGS. 2(c) and 2(d), a second optical medium 208 interfaces with the first optical medium 202. While the heterogeneous interface 206 traps light, it still may lead to some of the light leaking out of the core 108 and subsequently the optical pipe 102. The design shown in FIGS. 2(c) and 2(d) can achieve better performance and a substantially lossless propagation of trapped light. As can be seen from the cross-sectional profile, the heterogeneous interface 206 between the two optical media 202 and 208 of the core 108 has a "nested conical shape" such that one cone has a higher angle than the other. This can achieve almost completely lossless trapping and propagation of light in the core 108 over lengths of optical pipe 102 greater than 1 meter.

In one exemplary embodiment, when the angle of the light incident on the core 108 is about 20 degrees, the refractive indices of materials in the core 108 are about 1.6 and about 1.5 (ratio=1.067), and half-angles of the cones, related to angle 1 and angle 2 in FIGS. 2(c) and 2(d), at the heterogeneous interface is between about 14 degree and about 26 degrees. (It should be noted that this disclosure is not limited only to the exemplary embodiment.) When the incident light angles are increased up to about 30 degree, the half-angles of the conical heterogeneous interfaces 206 also increase proportionally while maintaining their difference in the range of about 12 degrees. In order for this design to work best, the refractive index difference between the two materials must be small (in the range of about 0.01 to about 0.2). At higher refractive index difference, the light may start to leak out of the core 108.

In one embodiment, the core has a third optical medium, which can be, in one instance, an air cavity, 210. In this design, there is a cylindrical (hollow, in one instance) space inside the core 108. The shape of the heterogeneous interface between two materials is the same as described and shown in FIGS. 2(c) and 2(d). The ratio of radius of core 108 to the radius of cross-section of the air cavity 210 is in the range of about 1.05 to about 2.0. The optimal value of this ratio is around the value of refractive index of the core medium.

FIGS. 2(c) and 2(d) show another design variation having a first optical medium 212 and a second optical medium 214. The high index medium in the core 108 can have the shape of an annular cylinder with the cladding layer outside it. On the inner side of this annular cylinder, there can be two optical media in the shape as shown in FIGS. 2(c) and 2(d) with the option of having the possibility of a third optical medium 222. The two heterogeneous optical media 212 and 214 have a difference of refractive indices in the range of about 0.02 to about 0.2. The medium with higher index is in contact with the high index annular cylindrical core materials. In that embodiment, the core includes three optically transparent optical media with refractive index of about 1.5 to about 2.2 for outermost layer, refractive index of about 1.4 to about 2.0 for intermediate layer, which has a conical interface with the innermost layer whose refractive index is in the range of about 1.3 to about 1.9. In any circumstance, the outermost core layer has a refractive index greater than that of the cladding layer 104 in its vicinity by 0.1.

In one or more embodiments, the light guide apparatus of these teachings also includes a super-cladding layer disposed on the cladding layer, wherein the super-cladding layer includes a first optically transparent medium that receives incident light and a second optically transparent medium interfacing with the first optically transparent medium to define a heterogeneous interface, wherein the heterogeneous interface, the first optical medium and the second optical medium are configured to convert a light beam incident on the super cladding at a first range of angles into a light beam exiting the super cladding in a second range of angles, the first range being wider than the second range. In one instance, the heterogeneous interface includes a number of bi-conic shapes.

For certain embodiments, the light guide apparatuses as shown in FIGS. 1(a) through 1(d) and 2(a) through 2(d) work well without additional layers, to guide light with an angular variation of about ±10 degrees with respect to the normal to the central axis 110. However, many light sources emit light with an angular spread of about ±30 degrees or more. For example, the sunlight is parallel but the sun's position has a seasonal variation of ±22.5 degrees. In such a situation, the best alternative is to guide light prior to entry of the cladding layer and the core. In order to pump light with an angular variation (of about ±30 degrees) from the normal to the central axis 110, an additional cladding layer (or a super-cladding layer) can be used as a light collimator.

FIG. 3 illustrates a light guide apparatus having a core, a cladding layer, and a super-cladding layer, in accordance with one embodiment of the present disclosure.

A super-cladding layer 302, which includes a heterogeneous interface 310 between two optically transparent media 304 and 306 in the shape is shown in the FIG. 3.

In one exemplary embodiment, the first optically transparent medium 304 has refractive index in the range of about 1.3 to about 1.8.

In the exemplary embodiment, the second optically transparent medium 306 has refractive index in the range of about 1.35 to about 2.0. The value of refractive index of the first optical medium 304 is matched to the refractive index of cladding layer 104. For optimal operation, the refractive index difference between the first optical medium 304 and the second optical medium 306 is in the range of about 0.02 to about 0.25.

As shown in FIG. 3, in the exemplary embodiment shown therein, the shape of the interface 310 is described as a repetitive unit whose primary unit consists of two steep cones attached back-to-back. (It should be noted that these teachings are not limited only to the exemplary embodiment.) The half-angle of these cones are in the range of about 75-89 degrees. As can be seen from the cross-sectional view, the angle 308 subtended by the surfaces of these two cones on each other at the point of contact is in the range of about 2-30 degrees.

The effect of the super-cladding layer 302 is to act as a "collimator" and convert light beam in a first predetermined range (in one exemplary embodiment, about ±30 degree) into light of angle of a second predetermined range (in the exemplary embodiment, about ±5 degrees or less) around the normal to the axis 110 of the optical pipe 102.

FIGS. 4(a) and 4(b) illustrate ray tracing diagrams for a light guide apparatus having a semi-conical core and a semi-conical cladding layer, in accordance with one embodiment of the present disclosure. FIG. 5 illustrates a ray tracing diagram for a light guide apparatus having a semi-conical core, a semi-conical cladding layer, and a semi-conical super-cladding layer, in accordance with one embodiment of the present disclosure. FIGS. 4 and 5 show the ray tracing diagrams to illustrate the path of light pumped into the optical pipe from the sides.

In FIG. 4(a), a parallel beam of light rays 408, which are perpendicular to the longitudinal axis 110, enter the cladding layer 104 of the optical pipe 102. The light rays 408 hit the parabolic conical air inclusions 406 at an angle above the critical angle for total internal reflection at the dense medium/air interface resulting in a reflected light rays at grazing incidence with respect to the longitudinal axis 110 on the core 108. The rays hit the semi-conical heterogeneous interface 414 and an angle greater that the critical angle for total internal reflection between optically dense medium 412 and optically rare medium 416, where the light rays 408 get deflected such that when the light rays 408 are incident on the core-cladding interface again, the angle of the incident ray is more than the critical angle at that interface and hence contained within the core. The trapped beam is shown as 410. In this particular ray tracing simulation, air is used for the optically rare medium 416 (refractive index=1).

FIG. 4(b) shows the ray tracing simulation of the same system as shown in FIG. 4(a), but with various parallel beams of light rays. Each of these light beams lies within the same plane. This plane is at an angle of 10 degrees from the radial axis 112 which itself is normal to the longitudinal axis 110 of the optical pipe 102. As can be seen from FIG. 4(b), a majority of the light rays (410) are contained within the dense medium 412 of the core 108 via total-internal-reflection at the heterogeneous interface 414 and the core-cladding interface. Some the light rays leak out (428) of the core since they do not meet the total-internal reflection criteria either at the core cladding interface or the heterogeneous interface 414.

FIG. 5 shows the ray traces for the optical pipe 102 with the use of a super-cladding layer 504 on top of the cladding layer 506 and the core 108. As shown in FIG. 5, a semi-conical core and a semi-cylindrical cladding layer with semi-conical inclusions. The purpose of the super-cladding layer 504 is to convert the input rays incident at an angle much further from the normal (with respect to the longitudinal axis 110) to an angle closer the normal (with respect to the longitudinal axis 110). This strategy therefore leads to a wider angular aperture of our light guide apparatus. In FIG. 5, light rays 508, 510 and 512 are incident on the optical pipe 102. These light rays pass through the super-cladding layer 504 to enter the cladding layer 506 where the light rays undergo total-internal-reflection when they hit the air inclusion of the cladding layer 506 in the shape of parabolic cone. These reflected rays then enter the dense medium 516 of the core 108. Inside the core 108, the light rays undergo total internal reflection at the heterogeneous interface 520 between dense medium 516 and rare medium 518. The semi-conical shape of the heterogeneous interface changes the angle of the reflected ray with respect to the longitudinal axis 110, thus allowing the rays to meet the total-internal reflection at the core-cladding interface. This results in light rays 514 which have been trapped inside the dense medium 516 or the core 108.

As can be seen from the FIG. 5, the light ray 508, which is incident at an angle −22.5 degrees from the normal, gets converted to an angle closer to the normal when it hits the cladding layer and therefore gets trapped and guided into the core 108. Similarly, the light ray 512, which is incident at an angle of +12 degrees with respect to the normal is also converted to an angle closer to the normal after going through the super-cladding layer 302.

FIGS. 6(a) through 6(c) illustrate ray tracing diagrams for a light guide apparatus having a core, in accordance with various embodiments of the present disclosure. The embodiment shown in FIG. 6(a) is similar to the core embodiment shown in FIG. 2(c). As shown in FIG. 6 (a), light entering the core in a predetermined range of angles with respect to a normal to the longitudinal axis is reflected in a manner that retains a light propagating inside the core.

One such ray is shown in FIG. 6(a) as ray 608 that enter the core at a grazing angle of incidence with respect to the longitudinal axis of the core 108. The core 108 as shown in FIG. 6(a) includes two optical media 606 and 604 with the heterogeneous interface 612 in the shape of an nested cones repeated along the longitudinal axis 110. As can be seen from the side view and top view of the core 108 in FIG. 6(a), the incident light 608 gets trapped inside the core 108. The trapped and propagating ray 610 undergoes multiple refractions and reflections at the heterogeneous interface 612 and total internal reflection at the core surface. In this particular ray trace, the light ray 608 is incident at an angle of 20 degrees with respect to the longitudinal axis 110. The refractive index of optical medium 606 is 1.5. The refractive index of optical medium 604 is 1.6. The half angles of the two nested cones are 14 and 26 degrees, respectively.

Figure 2A:
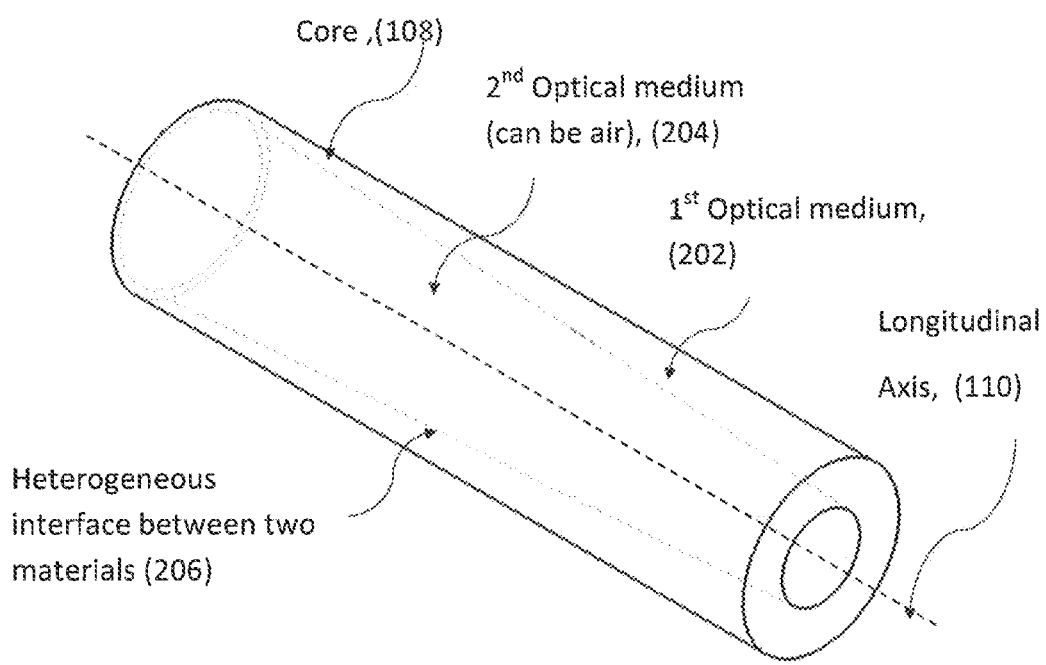
Figure 2A:
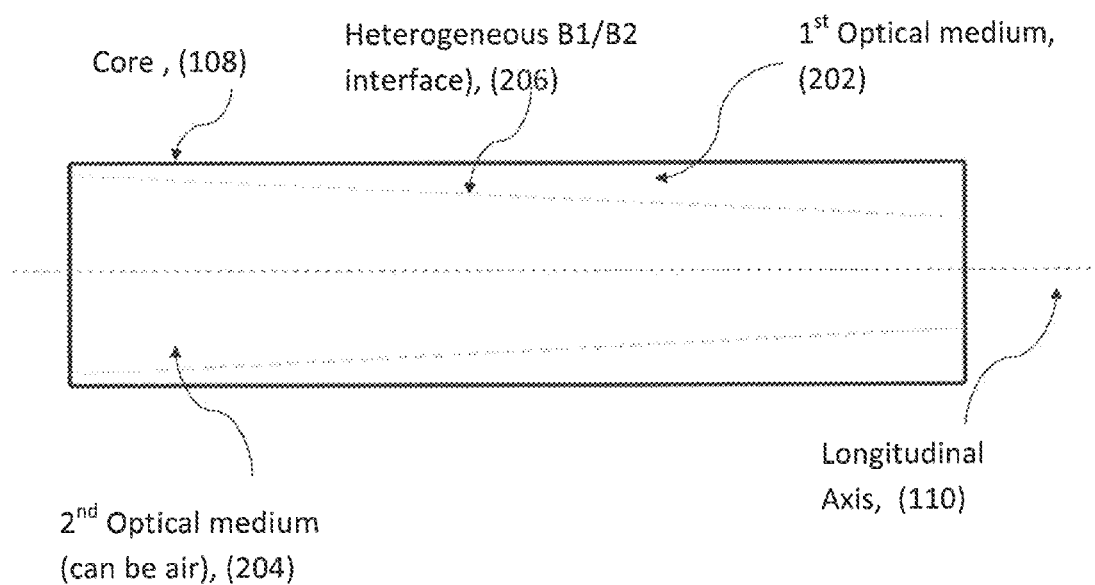
Figure 2B:
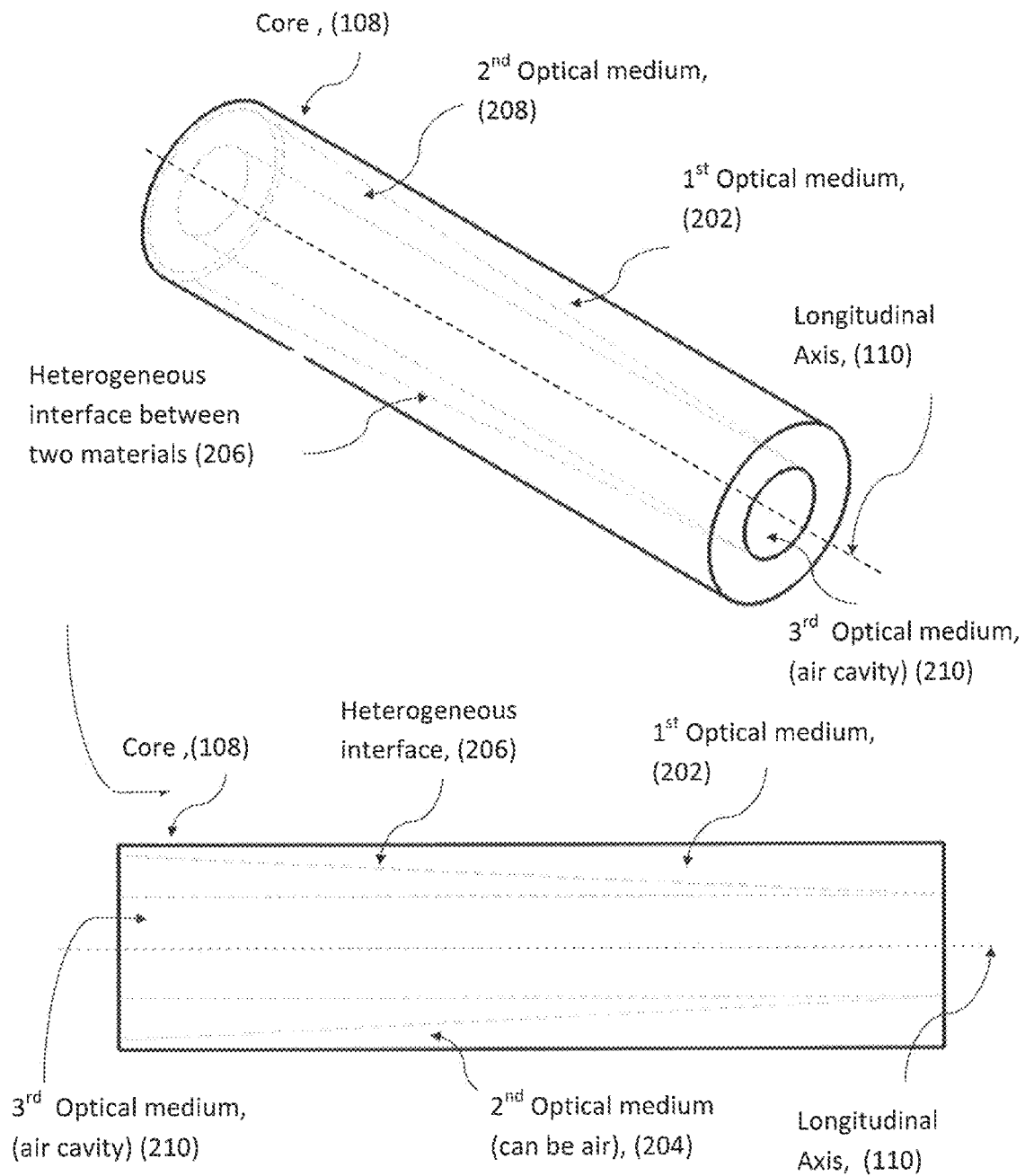

The embodiments shown in FIGS. 6 (b) and 6(c) are similar to the core embodiment shown in FIGS. 2(c) and 2 (d).

FIG. 6 (b) shows the side view and top view of the core 108 as shown in FIG. 2(d). The core 108 includes three optical media 614, 616, and 618. The heterogeneous interface between 614 and 616 is in the shape of nested cones repeated along the longitudinal axis 110. The shape of the interface between 614 and 618 is a cylinder around a longitudinal axis 110. In this particular ray tracing simulation, optical medium 618 is chosen to be air. However, the medium can have a refractive index higher or lower than medium 614 and in the range of 1.0 to 2.2. A light ray 620 is incident on the core 108 at a grazing angle with respect to the longitudinal axis 110. Three more rays are shown to be symmetrically placed around the circumference of the core 108, which are at the same grazing angle with respect to longitudinal axis 110. The light ray 620 after entering the core gets trapped and propagates as light ray 622 after going through a series of refractions and reflections at the heterogeneous interface 619, reflections at the 614/618 boundary, and reflections at the surface of the core 108.

FIG. 6(c) shows the effect of the cladding in providing incident radiation at angles closer to the normal to the longitudinal axis 110 into the core 108 the construction of which is similar to that shown in FIG. 6(b). FIG. 6(c) shows the top view ray trace of light ray 632 entering the core 108 after being reflected by a parabolic conical air inclusion 630. On entering the core 108, the light ray 632 undergoes refracted and reflected at heterogeneous interface 619 between the two optical media 614 and 614, reflection at the cylindrical interface of 614/618 and reflections at the surface of the core. All these processes trap and propagate the light ray along the length of the core and is labeled in the figure as 634. For this particular simulation same refractive indices and design of the core was chosen as was used in FIG. 6(b).

FIG. 7 illustrates a perspective view of a solar panel including an array of light guide apparatuses, in accordance with one embodiment of the present disclosure. In one embodiment, the solar panel includes an array of parallel optical pipes, as described above, and an array of solar cells coupled to an end of the parallel optical pipes. In one embodiment, the solar panel includes an optional back reflector. The array of parallel optical pipes shown in FIG. 7 can be side-pumped to achieve accumulated light to be collected at an end of the optical pipes. A back reflector may be placed below the array of light pipes to ensure that any light that gets lost form the light pipe can be pumped back in again.

As shown in FIG. 7, an array of solar cells is placed at the end of the optical pipe array. The array of light concentrators in FIG. 7 is one of the embodiments in FIGS. 1 (a)-1 (d). Although a back reflector is shown in FIG. 7, embodiments in which the back reflector is absent are also within the scope of these teachings. An array of solar cells receives the light concentrated by the optical pipe array. These solar cells can be a continuous strip or individual solar cells at the end of each optical pipe/fiber, and/or packaged together in serial or parallel arrangements. These solar cells can be attached to the array of light pipes by means of an optical transparent adhesive materials, such as an epoxy resin or silicone with an index matched or closer to that of light pipe.

If light from the sun is used as a source, the embodiment of the optical pipe array shown in FIG. 7 brings the benefit of pumping light into individual light pipes even if the position of the sun changes in the sky. For example, if this array is placed such that the longitudinal axis of the light pipe in oriented north-south direction, the various positions of sun going from morning to evening are equivalent in terms of the geometry of pumping the light and hence the efficiency of guiding light into the light pipe owing to the symmetry of our optical elements. Also, as described above, the additional cladding layers can bring the functionality that light with wider angles of aperture normal to the axis of the light pipe can also be guided into the light pipe. Thus, light can be pumped into the light pipe even when there is a seasonal variation (about 45 degrees) in the position of the sun. Therefore, the light guide apparatus of the present disclosure allows for the use of this optical pipe array as a non-tracking solar concentrator to collect the light at one end of the array. This concentrated light may be used for various purposes. One example is for power generation by placing an array of solar cells at the edge. It is appreciated that other uses are possible and are described further below.

As shown in FIG. 7, an array of individual cylindrical or half cylindrical concentrators (also referred to as optical pipes) can be assembled together, in one embodiment, to construct a light guide apparatus that can concentrate light with a wide angular aperture for incoming light. However, in other embodiments, it is also possible to use the elements of the core 108 and cladding 104 in a planar arrays such that the interface between core and cladding is also planar. FIG. 8(a) shows such a construction, with the cladding layer 802 in a cuboid shape consisting of an array of semi-conical air inclusions 806. Each column of the semi-conical inclusions has a common longitudinal axis 803. The core layer 804 as shown in FIG. 8(a) has the shape of a prismatic wedge with the angle of the wedge to be between 0.5 to 20 degrees.

The top view of the cladding layer 802 in FIG. 8(b) array includes a row and column array of semi-conical air inclusions 806. Each column includes an array of semi-conical inclusions that have a common longitudinal axis 803. The separation between each longitudinal axis equals the larger diameter of the identical conical inclusions. This leads to gaps 808 in the array. When light enters the cladding layer 802 through the gaps 808, there is a chance that it might not hit any of the conical inclusions 806 and hence would be transmitted instead of being guided into the core.

FIG. 8(c) shows top view of an array 810 of conical inclusions 812 which resembles the design of fish-scale. In this case, all the properties of individual conical inclusions are same as that described previously. However, the conical inclusions in adjacent columns are staggered and brought closer together such that the separation between longitudinal axes 114 for adjacent columns is less than the larger diameter of individual conical inclusions. This design ensures that all the light that hit the cladding layer is incident on one of the conical inclusions 812 and hence gets guided.

All the design variations to the conical inclusions as described previously, including the use of conical heterogeneous interfaces between a dense medium and rare medium, holds true in the case of the planar cladding layer as shown in FIGS. 8A-C.

While FIG. 8(a) shows the planar light concentrator using the embodiments of the light guide described in this invention, the use of a core in the shape of a prismatic wedge limits the concentration ratio (ratio of input aperture area to output area). However, as shown in FIG. 8(d), a planar core 818 includes a planar array of semi-conical heterogeneous interface 822 between optical media 818 and 820 can be used. Such a heterogeneous conical interface 822 can be obtained by using an array of longitudinal cross-section of conical heterogeneous interface 214 described in FIGS. 2(c) and 2(d). This conical heterogeneous interface 822 can also be in the fish-scale design array as described for the conical inclusions in FIG. 8(c). Furthermore, all the design variation to the core mentioned in previous sections, including all the optimal values of various design parameters, hold here as well.

In one instance, the light guide apparatus of the present disclosure allows for light trapping and propagation over long distances, substantially without loss, in a planar geometry of the core described in FIG. 8(d) and continuous pumping along the length of the structure leads to high concentration of light to be accumulated in the core. The heterogeneous interfaces in this planar core can be a repetition of a "nested semi-cone" motif with the semi-cone angles for the two cones are about 0.5-50 degrees and about 5-70 degrees. It is found that optimal performance of waveguiding can be achieved in this structure, and optical performance is achieved when the difference in angles of the two cones is in the range of about 5-20 degrees with the best value obtained around 12 degrees. Also, the refractive index difference between the two materials should be small (in the range of about 0.02 to 0.25) with best results obtained for a difference of about 0.07.

FIG. 8(e) shows a specific design variation such that the planar core 816 has a heterogeneous interface 828 in a prismatic shape instead of the semi-conical shape. However, the longitudinal cross-section in the FIG. 8(d) and FIG. 8(e) is the same. In one exemplary embodiment of FIG. 8(e), the two optical media 824 and 826 have the refractive index in the range of 1.3 to 2.2. However, in other embodiments, the requirement is that the refractive index difference between the two optical media is in the range of 0.01 to 0.3. The angles from horizontal of the two faces of the prismatic heterogeneous interface 828 are, in one exemplary embodiment, in the range of 0.5 to 70 degrees and 5 to 90 degrees respectively. The requirement, in other embodiments, is that the two angles are close to each other and their difference should be in the range of 1 to 40 degrees. In one instance, the difference in the angles is in the range of 4 to 20 degrees is preferred.

FIG. 8(f) shows the ray tracing simulation of the planar core 816 with a heterogeneous interface 828 as described in FIG. 8(e). As can be seen, the light beam 830 propagates through the planar core 816 without any loss of light from the core. For this particular ray tracing simulation, it is possible to obtain a substantially lossless propagation over a length of planar core greater than 1 meter. The input light is incident on the core 816 at an angle of 20 degrees from the cladding layer. The angles of the two faces of the prism are 14 and 26 degrees from horizontal. The index of optical medium 824 and 826 is 1.6 and 1.5 respectively. When the angle from horizontal of the incident light on the planar core 816 is increased, the angles of the faces of the prismatic heterogeneous interface 828 also need to be increased proportionally to ensure that the light is trapped and propagates in the core 816 without any loss.

FIG. 8(g) shows a specific design variation of the planar core in which the longitudinal cross-section looks similar to that described in FIG. 8(d) and FIG. 8(e). However, the planar core 832 as shown is FIG. 8(g) has a circular cross section in the third dimension as seen in the top view. The incident ray 838, in one exemplary embodiment, enters at an angle of 70 degrees from normal on the top surface and has a radial symmetry with respect to the circular cross-section. The input light aperture is the top surface while the output aperture is the cylindrical shape 842. It is evident that dramatically high concentrations can be achieved if the diameter of the cylinder 842 is chosen to be very small compared to the diameter of the circular input aperture.

Further, it is observed that this core design works even if the structure is prismatic as shown in the FIG. 8(f). The criteria for light trapping and propagation in this exemplary structure is that the angle of light incident on the core be lower than about 40 degrees (optimal results for 20 degrees), that the angles of the prisms should be in the range of about 2-30 degrees and about 7-40 degrees, and that the refractive index difference between two materials be in the range of about 0.02-0.2 (0.07 difference optimal).

For the case of planar core, the concentration ratio can be in the range of 100 to 1000× and can go even higher if the angular spread of the incoming light is not wide. When the angle aperture of incoming light (seasonal variation) is greater, a slight global taper in the range of 0.05 degree to 2 degrees can be used to trap and propagate light into the core. In order to address the angular spread of incoming light, one can utilize the concept of chirping where the two angles are varied systematically to achieve optimal waveguiding. This means that angular difference of the two nested semi-cones in the planar core is varied periodically, in small magnitude. In one instance, for an optimal case, the difference between the angles is increased by 0.5 degrees in each successive pair of nested-semi-cones until the difference is 14 degrees. The then the difference in angles is reduced back to 12 degrees in successive decrements of 0.5 degrees. The same concept of chirping also holds for planar core with prismatic faces as described in FIGS. 8(e) and 8(f).

FIGS. 9(a) through 9(e) illustrate a planar light guide apparatuses, in accordance with various embodiments of the present disclosure. As shown in FIG. 9, optical elements of cladding, core and supercladding are embedded in a planar material to make a solar panel. It is evident that a planar device in which light can be pumped in at a wide angular aperture and guided to the edge is easy to manufacture and can find multiple uses. In one aspect, the present disclosure provides a fabrication method of a planar light guide device that uses side pumping of light pipes.

FIG. 9(a) shows a scheme of operation of such a planar device (901) that guides incident light incident at multiple angles of the sun (180 degrees mornings to evening variation, and 45 degree seasonal variation). As such, the solar energy concentrator of the present disclosure does not need to track the sun.

This embodiment shown in FIGS. 9 (*a*)-9 (*c*) includes a cladding layer having an array of semi-conical inclusions. This layer is used to turn the incoming light into a grazing incidence. The top surface of this layer can be semi-cylindrical or flat. The material in this exemplary layer can have a refractive index in the range of about 1.3 to 2.0, but is always lower than at least one of the materials in the core.

All the variations in the shape of the cone described previously shown can also be used here as well. Instead of using an air inclusion, one can also use a conical interface between two optical materials with the material at the bottom having a lower refractive index. The index difference and the angle of the cone may be chosen in such a way that there is total internal reflection at this interface and hence an angle of light exiting this layer is a grazing angle.

In other embodiments, a whispering gallery mode circular ring resonators can be used for the core to replace the wedges at the bottom, as shown in FIG. 9(c). This allows for a grazing incidence light at wider range of angles to be guided into the core. The diameter of circular hollow spaces are much greater than that of the wavelength of light, and typically are in the range of about 5-500 microns.

FIG. 9(a) illustrates a planar light concentrator 901 using various embodiments of the light guide apparatus as described in this disclosure. This concentrator has a wide angular aperture which is represented by the angles 912 and angle 914 and can be used as a non-tracking solar concentrator. The angle 912 can be in the range 0 to 180 degrees and its maximum value of 180 degrees would represent the variation in the angle of the sun from morning to evening. The angle 914 can be in the range of +/−45 degrees from the normal. Its typical value of +/−22.5 degrees would represent the seasonal angular variation of the sun during the year. Any ray of light within this solid angle bounds represented by 912 and 914 will be guided into the planar light concentrator and gets propagated to its edge. 910 represent rays of light incident within this angular aperture. 911 represents the light that gets guided and propagates inside the planar light concentrator 901. The planar light concentrator consists of a multi-layer stack: a super-cladding layer 908, a cladding layer 904, a core layer 906 and a light guide layer 902 which is an extension of the core layer 906. An array of packaged solar cells 916 arranged in series and parallel configuration are attached to the edge of the planar light concentrator 901 and produce electrical power using the concentrated light as the input. This assembly including 901 and 916 can be used as a solar panel which uses only small area of active solar cell and does not need to track the sun.

The cladding layer 904 consists of various embodiments as described previously in this invention and is similar in construction to the planar cladding layer described in FIGS. 8(a), 8(b) and 8(c). The planar core layer 906 has similar construction to that described in FIGS. 8(d), 8(e) and 8(f). The light guide layer 902 is basically an extension of the dense medium of the core. This layer is optically transparent layer of glass or plastic with refractive index matching that of the dense medium of core and is higher in refractive index than the cladding layer 904. The super-cladding layer 908 is a collimating layer that takes light rays with a angular variation represented by angle 912 and converts them the a beam if light around the normal with an angular variation of +/−2.5 degrees. The super-cladding layer 908 includes optical elements described in FIG. 3 and the planar array of such optical elements has been described in detail in FIG. 9(d) and FIG. 9(e).

FIG. 9(b) is a longitudinal cross-section of the planar light concentrator 901 shown in FIG. 9(a). The cladding layer 904 has been shown here as a conical heterogeneous interface between a dense optical medium 918 and rare optical medium 920. The incoming light from the super-cladding layer 908, which, in one exemplary embodiment, is +/−2.5 degrees from the normal, hits this heterogeneous interface and is converted to grazing incidence with respect to the horizontal before entering the light guide layer 902 and the planar core layer 906. The planar core layer 906 traps and propagates the light in the light guide layer 902. The light guide layer 902 is made of glass or plastic, provided mechanical support to the concentrator, has refractive index higher than cladding layer 904 and a refractive index closer to the dense medium of the planar core 906.

FIG. 9(C) illustrates the use of a micro ring resonator layer 926 sandwiched between cladding layer 904 on top and light guide layer 902 and planar core layer 906 on the bottom. The micro ring resonator layer is to address the inefficiency of the super-cladding and cladding layer to turn incoming light ray beyond the angular range represented by angle 914 into a grazing incidence with respect to the horizontal. The ring resonator consists of the annular tube of an optical medium with high refractive index embedded in an optical medium with lower index medium (preferably air). In this configuration of the planar light concentrator

901, the angles of the faces of the heterogeneous interface planar core array 906 are reversed from positive angles to negative. Thus the path of trapped light in this case is inverted in the −x direction.

FIG. 9(*d*) illustrates the design of the planar super-cladding layer 908 as labeled in previous FIG. 9(*a*)-9(*c*). The purpose of the super-cladding layer 908 is to act as a passive collimating layer that converts any light within the angular variation described by angle 914 into a narrow range of angles (preferably +/−2.5 degrees) around the vertical. The optical element shown here is an extension of that shown in FIG. 3. In FIG. 3, the heterogeneous interface in the super-cladding layer was shown to have a repetitive bi-conical shape around the cladding layer and its longitudinal cross-section looks like an array of steep isosceles triangles. When we move to a planar light concentrator 901, the symmetry around the longitudinal axis is no longer critical and hence this layer can have a prismatic shape. As shown in FIG. 9(*d*), the performance of the super-cladding layer can be enhanced by adding a parabolic heterointerface right below the triangles resulting in the shape of a "oil drop". The optical medium 934 on top of the "oil drop" motif 936 is a optical medium if refractive index lower than optical medium 936 and is similar in refractive index to optical medium 938. In one embodiment, a criteria for the above design of super-cladding layer is the difference in refractive index between dense optical medium 936 and each of the rare optical media 934 and 938 is in the range of 0.02 to 0.2. In one instance, the preferred value is around 0.07 to 0.1. The isosceles triangle needs to be steep such that, in one exemplary embodiment, the vertex angle is in the range 1 to 25 degrees with the optimal value around 5 to 7 degrees. The parabola right below the triangle should be a steep parabola with the design strategy that its focus should be in close proximity to converging point of the light beam being refracted by the triangular hetero-interface.

FIG. 9(*e*) shows a cross section of the super-cladding layer used to collimate incident light, 950 from incoming angles of ±22.5 degrees to a near-normal (i.e. normal to the surface of the panel, 952) orientation. The output of the cladding is near-normal light, 962 with a small angular spread (±2.5 degrees or less) for use by the planar cladding layer and planar core optics as described in FIGS. 9(*a*) and 9(*b*).

The cladding includes four main elements; three layers of truncated triangular prism arrays 954, 954, 958, followed by a parabolic lens microarray 960, all of which are embedded inside a material of low refractive index, 964.

Each triangular prism layer is a periodic array, with a repeating unit comprising one small and one large triangle, both truncated at the top to expose a horizontal surface that allows normal (or near-normal) light to pass through undisturbed. This makes the unit a trapezoid. However, the unit is still referred herein as a triangle or truncated triangle for simplicity. This configuration of alternating small and large triangles is used to ensure that one repeating unit is not in the 'shadow' of another.

Incoming light strikes the triangular faces of the prism and undergoes refraction, moving towards the normal. The shape of the triangles in the individual prism layer as well as the relative alignment of the layers are so chosen to only affect the path of light rays with a large angular deviation from the normal, while letting near-normal light pass undisturbed.

There are three key requirements for the performance of the cladding layer:

(a) There is an offset between the repeating elements of one triangular prism layer and the next. In the absence of this offset, incoming light rays are not collimated monotonically towards the normal orientation, but instead alternate between moving towards and away from a normal orientation.

(b) Each triangular prism layer is scaled up to be twice as large as the layer above it. In the absence of this up-scaling, initially-normal light rays are deflected away from the normal.

(c) A small difference in the refractive indices between the materials making up the triangular prisms and the surrounding medium. In one particular instance, there refractive indices are 1.552, 1.563, 1.571, and 1.583 for the materials making up 954, 954, 958 and 964 respectively. While different materials can be used to make the different triangular prism layers, it is not a requirement and all the layers could be made out of the same two material set. The only key factor is their refractive index difference is small.

The three triangular layers are followed by a parabolic concave lens microarray that further "planarizes" the light to a more normal orientation. The lens faces 966 and 968 are nominally parabolic in this construction, although other surface shapes are also equally valid. This parabolic layer is used to collimate the light beam even further and is similar to the parabolic heterointerface described in FIG. 9(*d*).

FIG. 9(*f*) shows data for one embodiment of the structure in FIG. 9(*e*). FIG. 9(*f*) shows angular range of the output rays for one embodiment of the structure in FIG. 9(*e*) when the input angular range is +/−22.5 degrees form normal. As can be seen from the FIG. 9(*f*), the angular divergence of the output beam is +/−22.5 degrees. In this particular simulation, we found that the 97.5% of the input light in the angular range of +/−22.5 degrees is collimated into a output beam of angular range +/−2.5 degrees.

The materials used to fabricate the light guide apparatus as described in this invention can be glass, carbon based polymers, plastics, small organic molecules, polymers based on silicon-atom-backbone such as silicones and siloxanes. One may also choose to use mixtures of siloxanes with other polymers and small molecules to achieve specific mechanical properties as well as optical properties such as refractive index and dispersion. As described hereinbelow, these materials may be used in the liquid form and cross-linking agents added in small amounts to achieve a solid, semi-solid, elastomeric or gel-like layer after application of heat or UV light. Also, fluorinated polymers and fluorinated silicones and siloxanes may be specifically used to achieve low refractive index than the base non-fluorinated versions of the same polymers. Similarly, a sulfurized version of the polymers may be used to achieve a higher refractive index than the non-sulfurized versions of the same polymers. In some uses of the present disclosure, some liquids with different refractive indices such as water, mineral oil, organic solvents, fluorinated liquids etc may be also used. Also, for various embodiments described in this disclosure, we may use glass of various refractive index (1.4 to 2.2). In some instances we may use glass that may have low melting temperature to enable molding of glass.

Refraction at a polymer (or glass)/air interface can lead to splitting of the white light due to differences in the refractive index of the dense medium at various wavelengths (dispersion relation) while the index of air remains constant. However, if refraction happens at the interface of two optically dense materials with different refractive indices (n1 and n2) such that the ratio of n1/n2 is constant for each wavelength, then light of each wavelength is refracted by the same magnitude and hence no chromatic aberration. In optical simulations of the present disclosure, the choice of materials such that the material of higher index has a higher dispersion (low abbe number) while a material of lower index has a lower dispersion (higher abbe number) is made. This strategy is also leads to a much wider choice of available materials since many of the higher index materials have low abbe numbers. FIG. 10(a) shows the prescriptions for Materials Selection in the light guide apparatus of the present disclosure.

Materials with engineered refractive index can also be used by selective doping the optical media with small quantities (0.01% to 0.00001%) of dyes and chromophores that absorb light in specific parts of the spectrum. This strategy creates a tailored refractive index vs. wavelength distribution for one or both materials which can lead to wave-guiding for only certain parts of the spectrum. Materials whose refractive index vs. wavelength distribution has been engineered by mixing two materials with different refractive index vs. wavelength distributions can also be chosen. FIG. 10(b) shows an example of wave-guiding using above described strategy of material selection. Here we have chose to set a 'cutoff' by choosing a materials combination for the cladding layer such that the $n_1/n_2$ decreases slowly with wavelength going from 400 nm to 800 nm wavelength. At 800 nm, the $n_1/n_2$ ratio falls blow the threshold that is required for the incident light to undergo total-internal-reflection at the heterogeneous interface. Therefore the 800 nm light (and beyond) gets transmitted through the cladding layer with slight deviation in its path and hence does not contribute to the wave-guiding process. FIG. 10C shows the data for wave-guiding and transmission of light as a function of wavelength of light for predetermined material combination in the cladding layer. As can be seen from the figure, 100% of the light beyond 800 nm gets transmitted (no wave-guiding at all) while there is clear wave-guiding over 1 m length and ~60% collection of light at the edge for light in 400-800 nm range.

A similar strategy can be used in the core layer such that the $n_1/n_2$ ratio is different for the materials in the core layer and this would result in leakage of selected wavelengths of light from the core and wave-guiding of rest of the wavelengths of light in the spectrum.

The light guide apparatus as described in this invention can be made by widely used molding process. A mold which is negative of the design of the part that needs to be made. A cross-linkable liquid polymer or gel can be poured into the mold them peeled off once it solidifies. The mold can also be in the shape of a cylindrical drum, the rotating action of which can be used to prepare the parts in a continuous mold-and-peel, high speed roll-to-roll process.

In one embodiment, the present disclosure provides a method for fabricating the cladding layer or core in the light guide apparatus described above. As shown in FIG. 11(a), a first optically transparent material has a surface having a male portion 1102 (a plurality of protrusions) formed thereon. The first optical transparent material can be engaged with a second optically transparent material. The second optically transparent material has a surface having a female portion 1104 (a plurality of recesses or indentations) formed thereon. In one embodiment, the male and female portions are configured to have similar shapes, and the female portion is configured to be bigger than the male portion to leave a space for air inclusions 1106 in between after assembling them together. A location of each protrusion corresponds to a location of each indentation, thereby forming a number of inclusions. This fabrication method can be used to produce any light guide assembly that contain air inclusions, such as the core 108 and the cladding layer 104 as shown in FIG. 1(a).

In an exemplary embodiment, for the cladding layer, the male portion would have semi-conical protrusions on its surface and female portion will have semi-conical recesses on the surface. The recesses, in that exemplary embodiment, are slightly bigger in size (5-50 microns) in each dimension. When both the parts are assembled together to make one piece, there are air inclusions trapped inside the finished piece whose dimensions are equal to the difference in the dimensions of protrusions and recesses.

In one embodiment, the method further includes depositing a layer of a third optically transparent material over the surface of the first optically transparent material. The layer of the third optically transparent material may have a substantially constant or varying thickness, which is configured such that a shape of the surface of the first optically transparent material, after deposition, is substantially congruent with a shape of the surface of the second optically transparent material. After assembling, the third optically transparent material is disposed in the space between protrusions and indentations.

In one embodiment, the male portion 1102 has semi-conical protrusions on its surface, and the female portion 1104 has semi-conical recesses on its surface. The recesses are slightly bigger in size (5-50 microns) in each dimension. When the first and second optically transparent materials are assembled together to make one piece, there are air inclusions trapped inside the finished piece whose dimensions are equal to the difference in the dimensions of protrusions and recesses.

To have a complete cone assembly, two such parts with semi-cones can be assembled together to form part with full cone inclusions. In order to have air inclusions in finished part with special geometry, such as spiral air inclusions, the conical protrusions and recesses can have surface texture. The protrusions have concave surface texture while the recesses have convex surface texture. If the cross-sections of the texture is desired to be a full circle, each of the concave and convex surface texture may be a semicircle. Further, it is also possible to have convex and concave surface textures which are arcs of a circle such a 90 degree arc, 45 degree arc, and so on.

In another instance, where the inclusions are not air inclusions but are inclusions of a third optically transparent material different from the first and second optically transparent materials, a layer of the third optically transparent material of predetermined thickness is deposited on the male portion. The predetermined thickness is equal to about the difference in size between the protrusions in male portion and the recesses in the female portion. When the two parts are assembled together, the inclusions of the third optically transparent material are disposed between the male and female portions.

The first and second optically transparent materials and the size of the inclusions are selected such that a predetermined deflection of light, incident on the assembly within the range of angles with respect to a normal to a longitudinal axis, is obtained.

In yet another embodiment, the embodiment includes two different materials with a specific shape of the boundary of the two materials (heterogeneous interface). In fabricating such an embodiment, the first optical layer is prepared using molding method described above using a mold that has the shape of the heterogeneous interface to be prepared. The molded layer is then filled with the second optical material to create a final layer consisting of two different optical materials with a heterogeneous interface in a predetermined shape.

Although the light guide apparatus of the present disclosure has been described as a sun light concentrator, it is appreciated that other uses of the present disclosure are possible.

The planar light collector in various versions of FIG. 9(a)-9(e) uses various layers of optically transparent materials with the heterogeneous interface between to materials in a pre-determined geometry. While it is assumed that the layers in this light guide apparatus be solid to maintain mechanical integrity, one or more of the optically transparent materials may be liquid. These liquid layers may be sandwiched between solid layers, physically encapsulated to prevent their leakage and perform same optical functions as the solid materials of the same refractive index.

Also, in some manifestations of this invention, there can be air inclusions. Injection and withdrawal of optical fluids from the air inclusions in the cladding and the core cavity can result in loss of optical wave-guiding since the total internal reflection needs an interface between dense and rare medium. This concept can be used in our design to make smart windows which produce power when waveguiding is on (no liquid in cavity) and act as transparent windows when waveguiding is off (cavities filled with liquid).

In a manifestation of this invention where a optical liquid layer is used as a lower refractive index, the TIR happens at the interface of the dense solid medium and the rare liquid medium. If this liquid is pumped out of the device and replaced by another liquid whose refractive index is equal to the dense medium, the TIR at the interface of two materials is prevented and light is transmitted instead of being guided. Therefore a power producing smart window with an active control of light transmission (and guiding) of light using can be demonstrated using the influx and out-flux of optical fluids in our light guide apparatus.

FIG. 12(a) illustrates the concept of the smart window using the light guide apparatus as described in this invention.

Using the principle of reversibility of light, the light guide apparatus of the present disclosure can be used as a lighting device. A source of light is placed on one of the edges of the light guide apparatus such that the light emitted by the light source gets guided into the core and progressively leaks out of the light guide apparatus. In this case, the output of the light guide apparatus is its top surface that provides uniform illumination with a wide angular divergence of the output light rays. FIG. 12(b) shows an array of light emitting diodes acting as light sources place on the edge of the light guide apparatus.

The planar solar concentrators as described in FIG. 9(a) can be used for indoor lighting applications by replacing the solar cells on the edge of the light guide apparatus by an array of optical fibers. The concentrated light that is collected at the edge of the light guide apparatus can be pumped into individual optical fibers coupled to the edge. These optical fibers can then taken to the lighting fixtures inside a building to illuminate the interiors with natural day lighting.

Solar Thermal: The planar optical concentrators can be used to guide concentrated light onto and evacuated tube solar thermal water heater. The concentrated light makes the tube much hotter than in the regular water heaters. This will make the water heater more efficient because of the higher thermodynamic efficiency at a higher temperature of the tube. This scheme can also be used for solar thermal application where a thermal fluid flows inside a tube which runs through the edge of a cascade of planar concentrator. As an example, our calculation show that a cascade of 10 panels of 1 m×1 m area in this scheme can heat the thermal fluid at a temperature to 400 degrees if the mass flow rate of the thermal fluid is kept as a 0.06 kg/s through the tube.

FIG. 12(e) shows the schematic of the light trapping optics that we have demonstrated in our light guide apparatus to be used on top of a photovoltaic device to trap the light that leaves the photovoltaic device without getting absorbed. Such light trapping optics relies on the total internal reflection at the heterogeneous interface of the two optical materials. The optical laminate layer redirects the light back onto the photovoltaic device by converting the angle of the high angle photons to an angle that lies within the total internal reflection cone of the dense material/air interface.

One of the problems of luminescent concentrators is that the luminescent material emits light at all angles but only the emitted light that lie within the TIR cones is contained within the slab. The light emitted beyond the TIR cone is lost resulting in lower performance of the luminescent concentrators. These TIR losses will be overcome by laminating a multilayered stack of engineered optical layers which modify the angle of the light emitted beyond the TIR cone to shallower angles using the principles used in the design of the core in the light guide apparatus described in this invention. The design of optical layers as shown in FIG. 12F, consists of two optical polymers with a refractive index difference <0.1 and an interfacial structure consisting of an array scalene triangular prism with an included angle in the range of 10°-15°. The angles of the scalene triangles are chosen to achieve the TIR at the interface of the two polymers and trap the light emitted beyond the regular TIR cone. The small included angle and low refractive index difference is effective in propagating the trapped light with minimal loss.

FIG. 12(g) illustrates the use of the concentrated light output of light guide apparatus as described in this invention as an input for the optical pumping of the lasing medium in a laser device. The input to the light guide can be sun light or an array of diode lasers incident on the top surface of the planar optical concentrator. Various schemes have been proposed in the art to achieve optical pumping of the lasing medium beyond its lasing threshold. A high power source in a compact geometry is required to optically pump the laser. The concentrated light output at the edge of the light guide apparatus can be an effective method to achieve this goal as shown in FIG. 12(g).

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although embodiments of the present disclosure has been provided in detail, it is to be understood that the method and the apparatus of the present disclosure are provided for exemplary and illustrative purposes only. Various changes and/or modifications may be made by those skilled in the relevant art without departing from the spirit and scope of the present disclosure as defined in the appended claims.

What is claimed is:

1. A light guide apparatus having a core, the core comprising:
   a first optically transparent section comprising a first optical medium having a first index of refraction; and
   a second optically transparent section comprising a second optical medium having a second index of refraction, an interface between the first optically transparent section and the second optically transparent section defining a shape;
   the shape, the first index of refraction and the second index of refraction being configured such that light entering the core in a predetermined angular range is deflected, deflection comprising refraction, at the interface between the first optically transparent section and the second optically transparent section at an angle such that, when light impinges on a core-cladding interface, the light impinges on an interface between the core and a cladding at an angle at least equal to a critical angle for total internal reflection.

2. The light guide apparatus of claim 1, wherein the shape comprises a first conical frustum of a first half angle; and
   wherein a central axis of the first conical frustum substantially coincides with a longitudinal axis of the core.

3. The apparatus of claim 2, wherein the first conical frustum comprises a semicircular conical frustum.

4. The apparatus of claim 2, wherein the shape further comprises a second conical frustum of a second half angle, a central axis of the second conical frustum substantially coinciding with a longitudinal axis of the core.

5. The apparatus of claim 4, wherein the second half angle is greater than the first half angle.

6. The apparatus of claim 4, wherein a bottom base circumference of the first conical frustum coincides with a bottom base circumference of the second conical frustum.

7. The apparatus of claim 4, wherein a top base circumference of the first and second conical frustums substantially coincides with a cross-section of a curvilinear side surface of a central cylinder.

8. The apparatus of claim 4, wherein a bottom base circumference of the first conical frustum substantially coincides with a bottom base circumference of the second conical frustum.

9. The apparatus of claim 4, wherein the first half angle ranges from about 0.05 degrees to about 20 degrees, and the second half angle ranges from about 14 degrees to about 26 degrees.

10. The apparatus of claim 4, wherein the second frustum comprises a semicircular conical frustum.

11. The apparatus of claim 4, wherein the shape comprises a plurality of first conical frustums of the first half angle and a plurality of second conical frustums of the second half angle, wherein central axes of the first and second conical frustums substantially coincide with the longitudinal axis of the core.

12. The apparatus of claim 11, wherein one of the first conical frustums comprises a top base circumference that coincides with a top base circumference of a neighboring one of the second conical frustums.

13. The apparatus of claim 1, wherein the first index of refraction of the first optical medium ranges from about 1.5 to about 2.2, and the second index of refraction of the second optical medium ranges from about 1.4 to about 2.0.

14. The light guide apparatus of claim 1, wherein the core further comprises a third optically transparent section comprising a third optical medium, the third optically transparent section interfacing with the second optically transparent section to define a central cylinder.

15. The apparatus of claim 14, wherein the third optical medium is air or vacuum.

16. The apparatus of claim 14, wherein the second optical medium is same as the third optical medium.

* * * * *